United States Patent
Wu et al.

(10) Patent No.: US 11,871,511 B2
(45) Date of Patent: Jan. 9, 2024

(54) FLEXIBLE CIRCUIT MOTHER BOARD AND DETECTION METHOD THEREOF

(71) Applicant: WuHan TianMa Micro-electronics CO., LTD., Wuhan (CN)

(72) Inventors: Han Wu, Wuhan (CN); Houfu Gong, Wuhan (CN); Zhenhua Liang, Wuhan (CN); Xiang Huang, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 806 days.

(21) Appl. No.: 17/003,308

(22) Filed: Aug. 26, 2020

(65) Prior Publication Data

US 2021/0410289 A1   Dec. 30, 2021

(30) Foreign Application Priority Data

Jun. 29, 2020   (CN) .......................... 202010611913.2

(51) Int. Cl.
  *H05K 1/02*      (2006.01)
  *G01R 31/28*     (2006.01)
  *H01R 12/59*     (2011.01)
  *H01R 12/61*     (2011.01)
  (Continued)

(52) U.S. Cl.
  CPC ....... *H05K 1/0268* (2013.01); *G01R 31/2818* (2013.01); *H01R 12/592* (2013.01);
  (Continued)

(58) Field of Classification Search
  CPC .. H05K 3/0052; H05K 3/0097; H05K 1/0266; H05K 1/0268; H05K 1/111;
  (Continued)

(56) References Cited

U.S. PATENT DOCUMENTS 5,010,447 A * 4/1991 Wallace ............. G01R 31/2818
                                             361/767
5,578,934 A * 11/1996 Wood .................. H05K 3/4007
                                              324/750.05
(Continued)

FOREIGN PATENT DOCUMENTS

CN        1802080 A      7/2006
CN      107658234 A      2/2018
          (Continued)

OTHER PUBLICATIONS

Chinese Office Action dated Dec. 15, 2022, issued in related Chinese Application No. 202010611913.2 filed Jun. 29, 2020, 20 pages.

*Primary Examiner* — Steven L Yeninas
(74) *Attorney, Agent, or Firm* — Christensen O'Connor Johnson Kindness PLLC

(57) ABSTRACT

Provided are a flexible circuit mother board and a detection method. The flexible circuit mother board includes flexible circuit daughter boards, at least one detection terminal group and external pad groups corresponding to the flexible circuit daughter boards in one-to-one correspondence. Each flexible circuit daughter board has a bonding pad area adjacent to a corresponding one of the plurality of external pad groups. Each detection terminal group detects at least one flexible circuit daughter board, and each of the at least one detection terminal group comprises a plurality of detection terminals. Each flexible circuit daughter board includes a plurality of capacitors including a first electrode plate and a second electrode plate. Each of the first electrode plate and the second electrode plate is electrically connected to one detection terminal.

17 Claims, 19 Drawing Sheets

(51) Int. Cl.
  *H05K 1/11*  (2006.01)
  *H05K 3/00*  (2006.01)
  *H05K 3/30*  (2006.01)
  *H05K 3/40*  (2006.01)
(52) U.S. Cl.
  CPC ............. *H01R 12/61* (2013.01); *H05K 1/111* (2013.01); *H05K 3/0052* (2013.01); *H05K 3/0097* (2013.01); *H05K 3/303* (2013.01); *H05K 3/403* (2013.01); *H05K 2201/09781* (2013.01); *H05K 2201/10015* (2013.01); *H05K 2201/10022* (2013.01)
(58) Field of Classification Search
  CPC .................. H05K 3/303; H05K 3/403; H05K 2201/09781; H05K 2201/10015; H05K 2201/10022; G01R 31/2818; H01R 12/592; H01R 12/61
  See application file for complete search history.

(56) References Cited

U.S. PATENT DOCUMENTS

| | | | | |
|---|---|---|---|---|
| 6,501,664 | B1* | 12/2002 | Krieger | H05K 1/114 361/780 |
| 2017/0265297 | A1* | 9/2017 | Onishi | G01R 31/28 |
| 2020/0196452 | A1* | 6/2020 | Lee | G06F 3/04164 |
| 2021/0233875 | A1* | 7/2021 | Ong | H01L 23/49816 |

FOREIGN PATENT DOCUMENTS

| | | |
|---|---|---|
| CN | 109597252 A | 4/2019 |
| CN | 110515492 A | 11/2019 |
| CN | 111123170 A | 5/2020 |
| JP | 2016-219009 A | 12/2016 |
| KR | 10-2008-0015539 A | 2/2008 |

\* cited by examiner

FLEXIBLE CIRCUIT MOTHER BOARD AND DETECTION METHOD THEREOF

CROSS-REFERENCE TO RELATED APPLICATIONS

The present application claims priority to Chinese Patent Application No. 202010611913.2, filed on Jun. 29, 2020, the content of which is incorporated herein by reference in its entirety.

TECHNICAL FIELD

The present disclosure relates to the technical field of flexible circuit boards, and particularly, to a flexible circuit mother board and a detection method thereof.

BACKGROUND

In the related art, when manufacturing a flexible circuit board, a plurality of flexible circuit boards is usually manufactured into a large board, which is then cut to form individual flexible circuit daughter boards. This large board is referred as to a flexible circuit mother board, and the plurality of flexible circuit boards on the large board is referred as to flexible circuit daughter boards. In the manufacturing process, after a surface mount technology (SMT) of the flexible circuit mother board is completed, the flexible circuit daughter board will be detected to determine whether there is an open circuit or disconnection in a circuit of the flexible circuit daughter board, and whether a resistor performance, a capacitive performance and a diode performance of the circuit meet design requirements. When the detection results in all aspects meet the requirements, the flexible circuit mother board is cut to form the plurality of flexible circuit daughter boards, then the plurality of flexible circuit daughter boards is ready for delivery.

A capacity element in the circuit may have some small cracks after the SMT, and the existing detection methods cannot detect the small cracks of the capacitor. The small cracks will not affect use of the capacitor element at the beginning. However, when the flexible circuit board is assembled into a module for aging detection or in a process of continuous use of a terminal product, water vapor will penetrate through the small cracks of the capacitor and destroy a dielectric layer between capacitance plates. Acceleration of migration of ions between the capacitance plates will cause a short circuit of the capacitor, thereby leading to quality problems. Therefore, a technical problem to be solved urgently is to detect small cracks of the capacitor before the flexible circuit board is ready for delivery.

SUMMARY

The embodiments of the present disclosure provide a flexible circuit mother board and a detection method therefor, which can detect small cracks of a capacity element in the flexible circuit daughter board before the mother board is cut, so as to improve a quality of the flexible circuit board.

In a first aspect, an embodiment of the present disclosure provides a flexible circuit mother board, including a plurality of flexible circuit daughter boards, at least one detection terminal group, and a plurality of external pad groups corresponding to the plurality of flexible circuit daughter boards in one-to-one correspondence. Each of the plurality of flexible circuit daughter boards has a bonding pad area adjacent to a corresponding one of the plurality of external pad groups. Each of the at least one detection terminal group detects at least one of the plurality of flexible circuit daughter boards, and each of the at least one detection terminal group comprises a plurality of detection terminals. Each of the plurality of flexible circuit daughter boards comprises a plurality of capacitors, each of the plurality of capacitors comprises a first electrode plate and a second electrode plate, and each of the first electrode plate and the second electrode plate is electrically connected to one of the plurality of detection terminals.

In a second aspect, an embodiment of the present disclosure provides a detection method of a flexible circuit mother board. The flexible circuit mother board includes a plurality of flexible circuit daughter boards, at least one detection terminal group, and a plurality of external pad groups corresponding to the plurality of flexible circuit daughter boards in one-to-one correspondence. Each of the plurality of flexible circuit daughter boards has a bonding pad area adjacent to a corresponding one of the plurality of external pad groups. Each of the at least one detection terminal group detects at least one of the plurality of flexible circuit daughter boards, and each of the at least one detection terminal group comprises a plurality of detection terminals. Each of the plurality of flexible circuit daughter boards comprises a plurality of capacitors, each of the plurality of capacitors comprises a first electrode plate and a second electrode plate, and each of the first electrode plate and the second electrode plate is electrically connected to one of the plurality of detection terminals. The detection method is used to detect the flexible circuit mother board and comprises: pairing two of the plurality of detection terminals of one of the at least one detection terminal group to form a detection terminal pair for detecting, wherein one detection terminal of the detection terminal pair is electrically connected to at least one first electrode plate of the plurality of capacitors of at least one of the plurality of flexible circuit daughter boards, and the other one detection terminal of the detection terminal pair is electrically connected to at least one second electrode plate of the plurality of capacitors of at least one of the plurality of flexible circuit daughter boards; connecting the detection terminal pair to a constant voltage source, wherein one detection terminal of the detection terminal pair is grounded, and the other one detection terminal of the detection terminal pair is connected to a constant voltage, the constant voltage having a voltage value greater than a withstand voltage value of at least one capacitor electrically connected the detection terminal pair; detecting a current in a loop where the detection terminal pair and the at least one capacitor are located to obtain a primary detection current value; and comparing the primary detection current value with a first current threshold corresponding to the detection terminal pair, wherein in response to a comparison result of the primary detection current value being greater than the first current threshold, it is determined that the at least one capacitor is abnormal; and in response to a comparison result of the primary detection current value being smaller than or equal to the first current threshold, it is determined that each of the at least one capacitor is normal.

In a third aspect, an embodiment of the present disclosure provides a detection method of a flexible circuit mother board. The flexible circuit mother board includes a plurality of flexible circuit daughter boards, at least one detection terminal group, and a plurality of external pad groups corresponding to the plurality of flexible circuit daughter boards in one-to-one correspondence. Each of the plurality of flexible circuit daughter boards has a bonding pad area adjacent to a corresponding one of the plurality of external pad groups. Each of the at least one detection terminal group detects at least one of the plurality of flexible circuit daughter boards, and each of the at least one detection terminal group comprises a plurality of detection terminals. Each of the plurality of flexible circuit daughter boards comprises a plurality of capacitors, each of the plurality of capacitors comprises a first electrode plate and a second electrode plate, and each of the first electrode plate and the second electrode plate is electrically connected to one of the plurality of detection terminals. The detection method is used to detect the flexible circuit mother board and comprises: placing the flexible circuit mother board in an aging detection environment, and monitoring the flexible circuit mother board in real time; pairing two of the plurality of detection terminals of one of the at least one detection terminal group to form a detection terminal pair for detecting, wherein one detection terminal of the detection terminal pair is electrically connected to at least one first electrode plate of the plurality of capacitors of at least one of the plurality of flexible circuit daughter boards, and the other one detection terminal of the detection terminal pair is electrically connected to at least one second electrode plate of the plurality of capacitors of at least one of the plurality of flexible circuit daughter boards; connecting the detection terminal pair to a constant voltage source, wherein one detection terminal of the detection terminal pair is grounded, and the other one detection terminal of the detection terminal pair is connected to a constant voltage having a voltage value smaller than or equal to a withstand voltage value of the at least one capacitor electrically connected the detection terminal pair; detecting a current in a loop where the detection terminal pair and the at least one capacitor are located to obtain a primary detection current value; and comparing the primary detection current value with a first current threshold corresponding to the detection terminal pair, wherein in response to a comparison result of the primary detection current value being greater than the first current threshold, it is determined that the at least one capacitor is abnormal; and in response to a comparison result of the primary detection current value being smaller than or equal to the first current threshold, it is determined that each of the at least one capacitor is normal.

BRIEF DESCRIPTION OF DRAWINGS

In order to more clearly illustrate technical solutions in embodiments of the present disclosure or in the related art, the accompanying drawings used in the embodiments and in the related art are briefly introduced as follows. It should be noted that the drawings described as follows are representative embodiments of the present disclosure.

DESCRIPTION OF EMBODIMENTS

In order to make the purpose, technical solutions, and advantages of the embodiments of the present disclosure be understandable, the technical solutions in the embodiments of the present disclosure are described in the following with reference to the accompanying drawings. It should be understood that the described embodiments are representative embodiments of the present disclosure, and shall not be interpreted as providing limitations to the present disclosure.

The terms used in the embodiments of the present disclosure are for the purpose of describing representative embodiments, but not intended to limit the present disclosure. Unless otherwise noted in the context, the singular form expressions such as "a", "an", "the" and "said" used in the embodiments and appended claims of the present disclosure also represent plural form expressions.

An embodiment of the present disclosure provides a flexible circuit mother board. The flexible circuit mother board includes a plurality of flexible circuit daughter boards. The flexible circuit mother board is provided with at least one detection terminal group configured to detect at least one flexible circuit daughter board. Each of two electrode plates of the capacitor in the flexible circuit daughter board is electrically connected to a detection terminal in the detection terminal group. In order to detect reliability of the capacitive performance and to determine whether the capacitor has small cracks, a voltage greater than a withstand voltage value of the capacitor is applied to the two electrode plates of the capacitor through the detection terminal, or a certain voltage is applied to the two electrode plates of the capacitor through the detection terminal in an aging detection environment. In this way, the reliability of the capacitive performance can be monitored in advance before the flexible circuit board is ready for delivery, thereby improving a quality monitoring level and improving a product quality.

Figure 1:
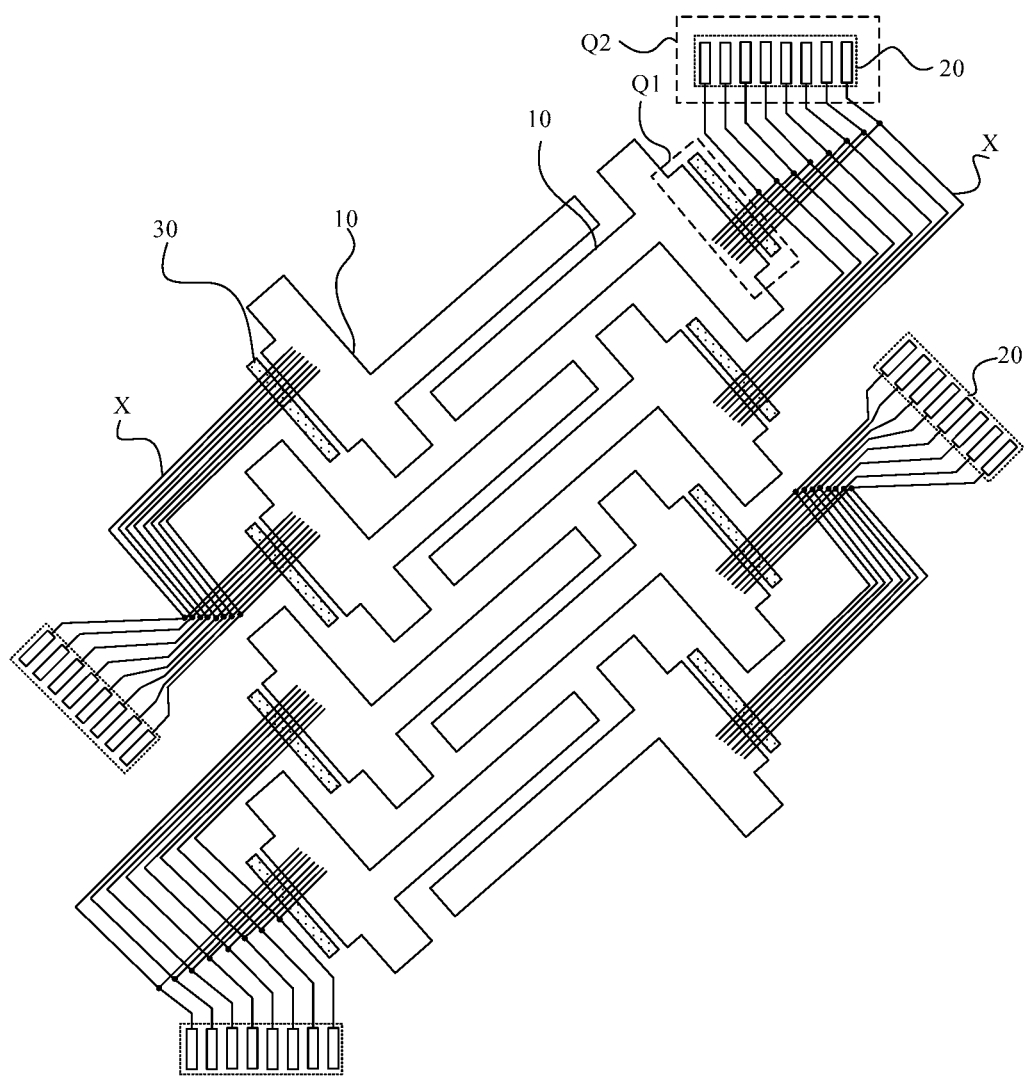
FIG. 1 is a partial schematic diagram of a flexible circuit mother board according to an embodiment of the present disclosure.
Figure 2:
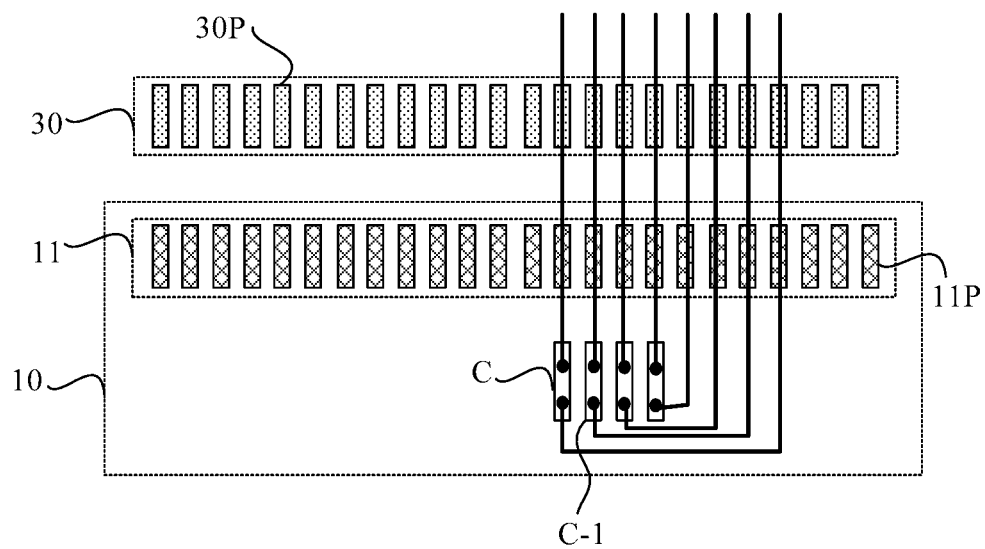
FIG. 2 is an enlarged schematic diagram of an area Q1 shown in FIG. 1.
Figure 3:
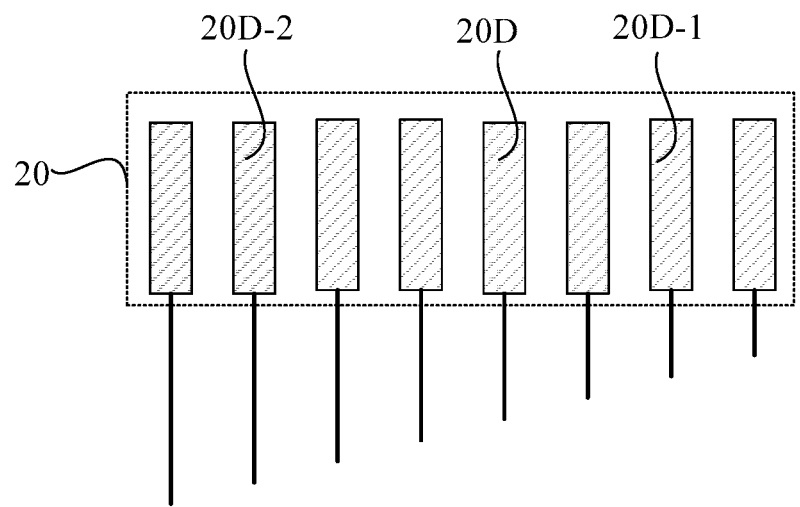
FIG. 3 is an enlarged schematic diagram of an area Q2 shown in FIG. 1.

FIG. 1 is a partial schematic diagram of a flexible circuit mother board according to an embodiment of the present disclosure. FIG. 2 is an enlarged schematic diagram of an area Q1 shown in FIG. 1. FIG. 3 is an enlarged schematic diagram of an area Q2 shown in FIG. 1.

As shown in FIG. 1, the flexible circuit mother board includes a plurality of flexible circuit daughter boards 10, at least one detection terminal group 20, and a plurality of external pad groups 30. FIG. 1 schematically illustrates the plurality of flexible circuit daughter boards arranged in a staggered manner, in order to save space, and thus a larger number of flexible circuit daughter boards can be provided on the flexible circuit mother board to improve productivity.

As shown in FIG. 2, the plurality of external pad groups 30 correspond to the plurality of flexible circuit daughter boards 10 in one-to-one correspondence. The flexible circuit daughter board 10 includes a bonding pad area 11, and the external pad group 30 is adjacent to the bonding pad area 11. A plurality of bonding pads 11P are provided in the bonding pad area 11. After the flexible circuit mother board is cut to form the plurality of flexible circuit boards, the bonding pad area 11 is configured to be bonded and connected to a module structure. For example, in the display field, the flexible circuit board is bonded and connected to a bonding area of the display panel through the plurality of bonding pads 11P in the bonding pad area 11. The external pad group 30 is arranged outside the flexible circuit daughter board 10, and the external pad group 30 includes a plurality of external pads 30P connected to components of an internal circuit of the flexible circuit daughter board 10. After a surface mount technology (SMT) of the flexible circuit mother board is completed, the external pads 30P in the external pad group 30 are used to detect an open circuit or disconnection in a circuit of the flexible circuit daughter board, as well as a resistor performance, a capacitive performance and a diode performance of the circuit.

One detection terminal group 20 is configured to detect at least one flexible circuit daughter board 10. As shown in FIG. 1, two flexible circuit daughter boards 10 are connected to the same one detection terminal group 20. Each detection terminal group 20 includes a plurality of detection terminals 20D. The flexible circuit daughter board 10 includes a plurality of capacitors C, and each of the capacitors C includes a first electrode plate and a second electrode plate that are electrically connected to a respective one detection terminal 20D. It can be understood that the capacitor C includes two electrode plates opposite to each other, and a dielectric layer provided between the two electrode plates. The first electrode plate and the second electrode plate are not shown. In the figures, the capacitor C is schematically shown in a strip shape, and an end of the strip shape is the first electrode plate and the other end is the second electrode plate.

In the flexible circuit mother board provided by this embodiment of the present disclosure, each flexible circuit daughter board may correspond to one detection terminal group configured to detect the corresponding flexible circuit daughter board; or two or more flexible circuit daughter boards correspond to one detection terminal group configured to detect these corresponding flexible circuit daughter boards. It is also possible that multiple detection terminal groups are configured to detect only some of the flexible circuit daughter boards.

In addition, FIG. 1 shows that the detection terminal group 20 is arranged in a peripheral area of the flexible circuit daughter board 10, and the arrangement of the detection terminal group 20 shown in FIG. 1 is for schematic illustration. In an embodiment, the flexible circuit daughter boards 10 may be partitioned, and the detection terminal groups 20 used to detect the flexible circuit daughter boards 10 in one partition may be gathered together. A position of the detection terminal group 20 in the flexible circuit mother board can be selected according to specific needs.

Figure 4:
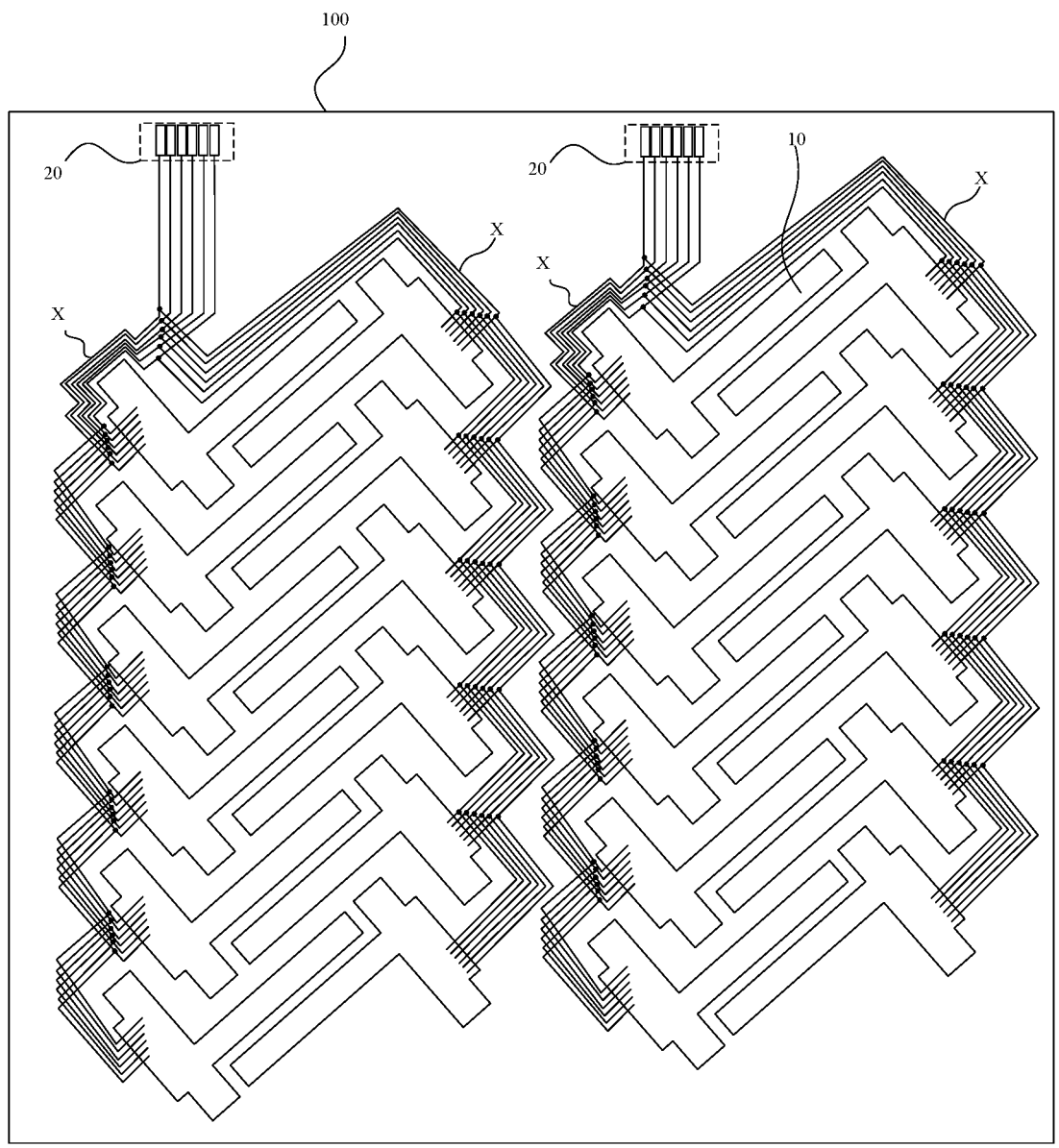
FIG. 4 is a schematic diagram of a flexible circuit mother board according to an embodiment of the present disclosure.

FIG. 4 is a schematic diagram of a flexible circuit mother board according to an embodiment of the present disclosure. As shown in FIG. 4, the detection terminal group 20 is arranged at an edge of the flexible circuit mother boards 100 without changing the arrangement of flexible circuit daughter boards 10 in the flexible circuit mother board. The detection terminals in the detection terminal group 20 are respectively connected to the capacitors in the flexible circuit daughter boards 10 only through connection wires X. For the purpose of illustrating a position of the detection terminal group 20, structures such as the external pad and the bonding pad are not shown in FIG. 4.

In the present embodiment of the present disclosure, the flexible circuit mother board is provided with the external pad group and the detection terminal group. The external pad group can be used to detect whether there is an open circuit or disconnection in the circuit of the flexible circuit daughter board, as well as the resistor performance, the capacitive performance, and the diode performance in the circuit. The detection terminal group can be used to detect reliability of the capacitive performance in the flexible circuit daughter board. The two electrode plates of the capacitor in the flexible circuit daughter board are electrically connected to two detection terminals in the detection terminal group, respectively. The detection terminal group detects and determines whether the capacitor has small cracks, so as to monitor the reliability of the capacitive performance in advance before the flexible circuit board is ready for delivery, thereby increasing a quality monitoring degree and improving a product quality. Hereinafter, the detection methods used in the embodiments of the present disclosure will be described by means of examples.

Figure 5:
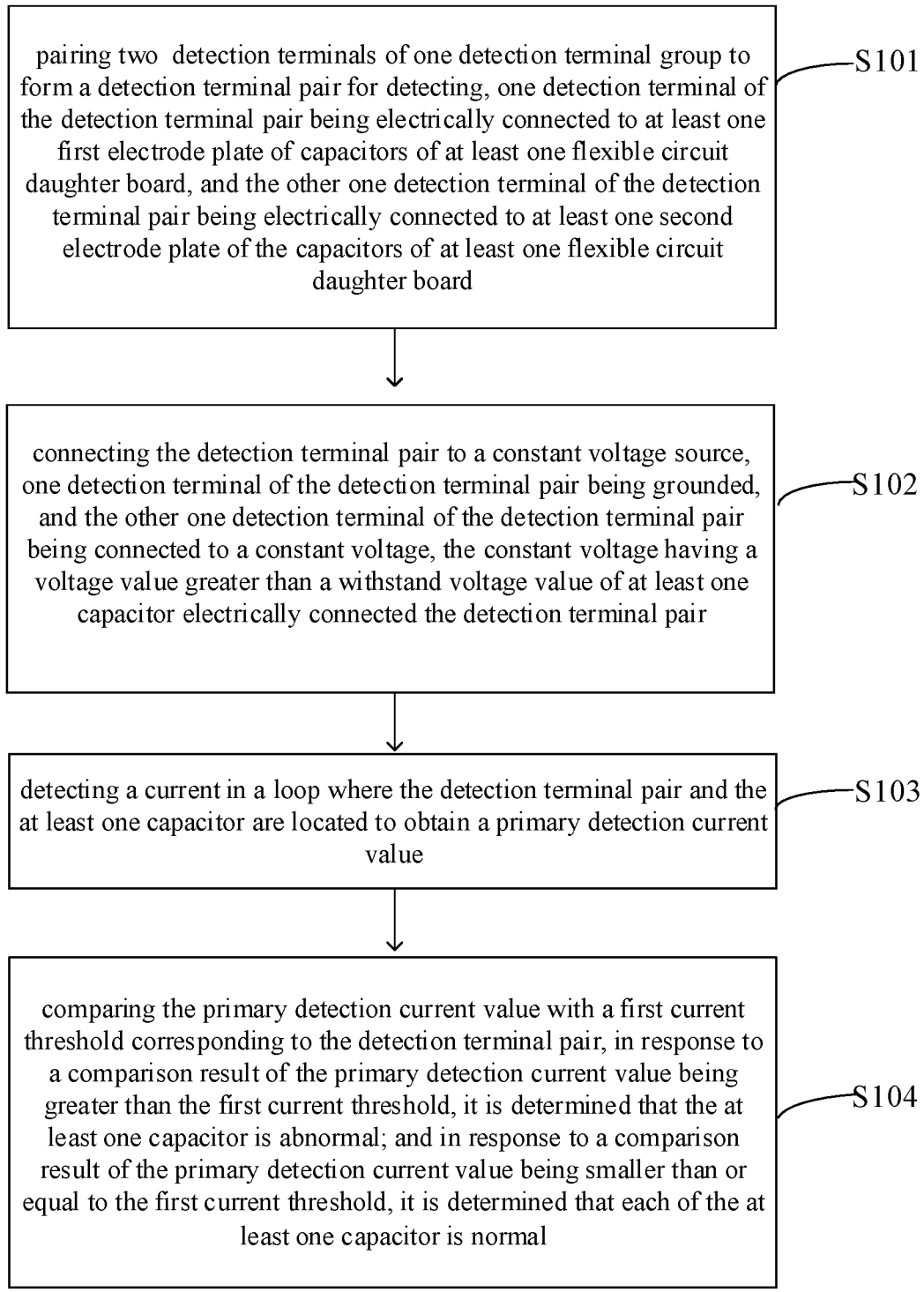
FIG. 5 is a flow chart of a detection method of a flexible circuit mother board according to an embodiment of the present disclosure.

FIG. 5 is a flow chart of a detection method of a flexible circuit mother board according to an embodiment of the present disclosure. In an embodiment, as shown in FIG. 5, the detection method includes following steps.

In step S101, a detection terminal pair is detected, and the detection terminal pair includes two detection terminals in the detection terminal group that are electrically connected to the first electrode plate and the second electrode plate of the capacitor. The flexible circuit daughter board includes a plurality of capacitors. The two electrode plates of each capacitor are connected to two detection terminals, respectively, and the two detection terminals connected to the capacitor are combined to form a detection terminal pair during detection; or two or more capacitors in the flexible circuit daughter board are connected to the same detection terminal pair. In addition, when one detection terminal group detects two or more flexible circuit daughter boards at the same time, the capacitors in different flexible circuit daughter boards are electrically connected to a same detection terminal pair, which can detect multiple capacitors in multiple flexible circuit daughter boards. In the above-mentioned cases, the plurality of detection terminals in the detection terminal group is combined to form pairs, and two detection terminals are combined to form a detection terminal pair to perform detections.

At step S102, the detection terminal pair is connected to a constant voltage source. One detection terminal of the detection terminal pair is grounded, and the other detection terminal of the detection terminal pair is connected to a constant voltage. A voltage value of the constant voltage is greater than a withstand voltage value of at lease one capacitor electrically connected to the detection terminal pair. In this step, the detection terminal pair and the at least one capacitor electrically connected to the detection terminal pair form a current loop. In the following steps, reliability of the capacitive performance can be determined based on a current in the loop.

The withstand voltage value of the capacitor is a rated working voltage of the capacitor, and the rated working voltage of the capacitor is greater than a working voltage during actual operation. In general, the rated working voltage of the capacitor is 1.5 to 3 times greater than the actual working voltage. Considering pulsating components contained in the circuit, a maximum value of the pulsating DC voltage cannot exceed the rated working voltage of the capacitor, so as to protect the capacitor from being damaged due to excessive voltage during operation.

At step S103, a current in the loop where the detection terminal pair and the at least one capacitor are located is detected, so as to obtain a primary detection current value.

At step S104, the primary detection current value is compared with a first current threshold. One detection terminal pair corresponds to one first current threshold. If the primary detection current value is greater than the first current threshold, then it is determined that the capacitor is abnormal; and if the primary detection current value is smaller than or equal to the first current threshold, it is determined that the capacitor is normal.

In the current loop formed by the detection terminal pair and the at least one capacitor electrically connected to the detection terminal pair, the detection terminal pair is connected to a constant voltage. Then, when the capacitive performance is reliable, the current in the loop has small fluctuation. If the capacitor has small cracks, the capacitor will be damaged when a large voltage is applied to the capacitor. Thus, the capacitor is short-circuited with a ground terminal, and the current in the loop will increase significantly, and it is determined that the capacitor in the loop is abnormal. In this way, by detecting a magnitude of the current in the loop, it can be determined whether the capacitor is normal or not. When the above-mentioned detection method is used for detection, the voltage value of the constant voltage source in the detection can be designed based on the withstand voltage value of a specific capacitor. Meanwhile, based on the number of capacitors connected to the detection terminal pair, a current threshold, e.g., the first current threshold, in the loop during detection is calculated in advance. When one detection terminal pair is used to detect multiple capacitors, the multiple are connected in parallel in the loop. Based on a connection manner in which the detection terminal pair is connected to the capacitor, one detection terminal pair corresponds to one first current threshold.

For example, with reference to FIG. 2 and FIG. 3, FIG. 2 illustrates a capacitor C-1, and two electrode plates of the capacitor C-1 are connected to a detection terminal 20D-1 and a detection terminal 20D-2 respectively through the connection wires in the flexible circuit mother board. One electrode plate of the capacitor C-1 is connected to the detection terminal 20D-1, and the other electrode plate of the capacitor C-1 is connected to the detection terminal 20D-2. Then, the detection terminal 20D-1 and the detection terminal 20D-2 are combined to form a detection terminal pair for detecting the capacitor C-1.

During detection, the detection terminal 20D-1 is grounded and the detection terminal 20D-2 is connected to a constant voltage. If a voltage value of the constant voltage is greater than the withstand voltage value of the capacitor C-1, the detection terminal pair and the capacitor C-1 together form a current loop, in which the current flows. Then, the current in the loop where the detection terminal pair (the detection terminal 20D-1 and the detection terminal 20D-2) and the capacitor C-1 are located is detected, so as to obtain the primary detection current value Ia. Then, the primary detection current value Ia is compared with the first current threshold $I_1o$. If the primary detection current value Ia is smaller than or equal to the first current threshold $I_1o$, it is determined that the capacitor is normal; and if the primary detection current value Ia is greater than the first current threshold $I_1o$, it is determined that the capacitor is abnormal.

When determining whether the capacitor is normal or not, the detection result depends upon specific circumstances such as the number of capacitors electrically connected to the detection terminal pair, and whether the capacitors connected to the detection terminal pair belong to a same flexible circuit daughter board or belong to different flexible circuit daughter boards. For example, in a first embodiment, one detection terminal pair is electrically connected to one capacitor. If the primary detection current value is greater than the first current threshold, it is determined that the capacitor is abnormal, and during such a detection, it can be determined that the flexible circuit daughter board detected by the detection terminal group is abnormal, so as to monitor the performance of the flexible circuit board is achieved. In a second embodiment, one detection terminal pair is electrically connected to multiple capacitors in one flexible circuit daughter board. If the primary detection current value is greater than the first current threshold, it is determined that the multiple capacitors include at least one abnormal capacitor, and it is also determined that the flexible circuit daughter board detected by the detection terminal group is abnormal. In a third embodiment, one detection terminal group is used to detect multiple flexible circuit daughter boards, and one detection terminal pair is electrically connected to the capacitors of different flexible circuit daughter boards. In this case, if the primary detection current value is greater than the first current threshold, it can be determined that the capacitors include at least one abnormal capacitor, but it cannot determine which flexible circuit daughter board includes the abnormal capacitor. For the third embodiment, the present disclosure provides another detection method for detecting which flexible circuit daughter board includes the abnormal capacitor, so as to determine the abnormal flexible circuit daughter board and improve the product yield. Such a detection method is described in the following specific embodiments.

Figure 6:
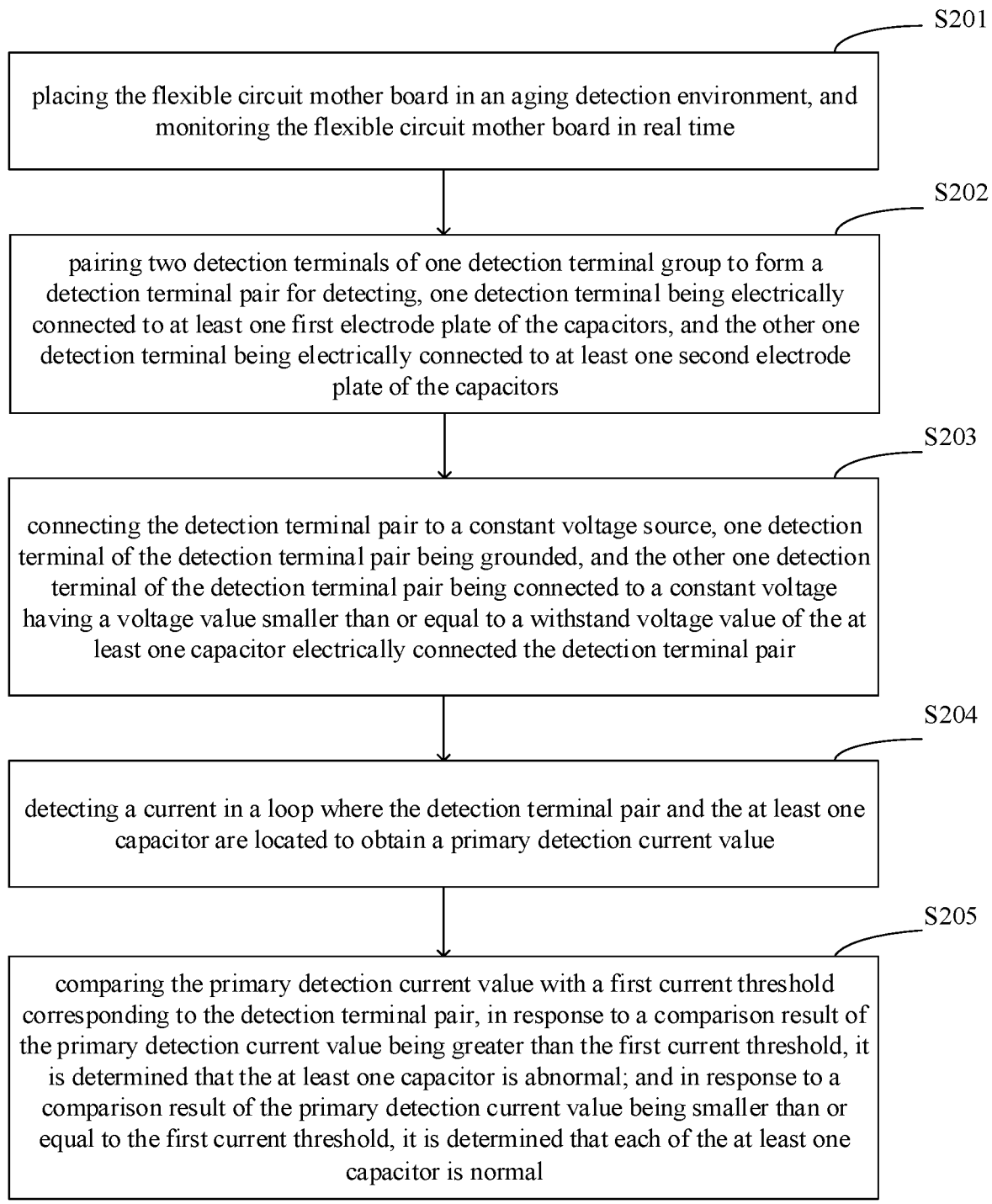
FIG. 6 is a flow chart of another detection method of a flexible circuit mother board according to an embodiment of the present disclosure.

FIG. 6 is a flow chart of another detection method of a flexible circuit mother board according to an embodiment of the present disclosure. In another embodiment, as shown in FIG. 6, the detection method of the flexible circuit mother board includes following steps.

At step S201, the flexible circuit mother board is placed in an aging detection environment, and the flexible circuit mother board is monitored in real time. Specific conditions of the aging detection environment can be set according to product design requirements. For example, the aging detection environment is an environment having a temperature of 60° C. and a humidity of 90%.

At step S202, a detection terminal pair, which includes two detection terminals in the detection terminal group that are electrically connected to the first electrode plate and the second electrode plate of at least one capacitor, is detected. The detection terminal pair in the detection terminal group is described in the embodiment illustrated in FIG. 5, which will not be repeated herein.

At step S203, the detection terminal pair is connected to a constant voltage source. One detection terminal of the detection terminal pair is grounded, and the other detection terminal of the detection terminal pair is connected to a constant voltage. A voltage value of the constant voltage is smaller than or equal to a withstand voltage value of the capacitor electrically connected to the detection terminal pair. At this step, the detection terminal pair and the at least one capacitor electrically connected to the detection terminal pair together form a current loop. A voltage value of the constant voltage source connected to the detection terminal pair is smaller than or equal to the withstand voltage value of the capacitor, so as to simulate a normal operational state of the capacitor.

At step S204, a current in a loop where the detection terminal pair and the at least one capacitor are located is detected to obtain a primary detection current value.

At step S205, the primary detection current value is compared with the first current threshold. Here, one detection terminal pair corresponds to one first current threshold. If the primary detection current value is greater than the first current threshold, it is determined that the at least one capacitor is abnormal; and if the primary detection current value is smaller than or equal to the first current threshold, it is determined that the at least one capacitor is normal.

The current threshold, e.g., the first current threshold, in the loop during detection is calculated in advance based on the number of capacitors connected to the detection terminal pair. When one detection terminal pair is used to detect multiple capacitors, the multiple capacitors are connected in parallel in the loop. Depending upon the connection manner that the detection terminal pair is connected to the capacitors, one detection terminal pair corresponds to one first current threshold. In the above-mentioned steps, the flexible circuit mother board is placed in the aging detection environment, and the detection terminal pair is connected to the constant voltage source, so as to achieve a dynamic aging detection of the capacitive performance and simulate an operational state of the capacitor in practical use. In the dynamic aging detection, it is determined whether the long-term operational state results in the abnormality of the capacitors. If the capacitor does not have small cracks, the capacitive performance changes slightly after long-term operation, and a small fluctuation of the current in the detection loop is detected. During the detection, the primary detection current value is within a threshold range (that is, smaller than the first current threshold), and it is determined that the capacitor is not abnormal. If the capacitor has damages such as small cracks, the capacitor will have serious aging and damage after long-term operation. Eventually, the capacitor is short-circuited with the ground terminal, and the current detected in the detection loop will increase significantly. During the detection, if the primary detection current value is greater than the first current threshold, it is determined that the capacitor is abnormal.

For example, with reference to FIG. 2 and FIG. 3, FIG. 2 illustrates a capacitor C-1, and two electrode plates of the capacitor C-1 are connected to a detection terminal 20D-1 and a detection terminal 20D-2 respectively through the connection wires in the flexible circuit mother board. One electrode plate of the capacitor C-1 is connected to the detection terminal 20D-1, and the other electrode plate of the capacitor C-1 is connected to the detection terminal 20D-2. Then, the detection terminal 20D-1 and the detection terminal 20D-2 are combined as a detection terminal pair for detecting the capacitor C-1.

During detection, the flexible circuit mother board is first placed in the aging detection environment, then the detection terminal 20D-1 is grounded and the detection terminal 20D-2 is connected to a constant voltage. If a voltage value of the constant voltage is greater than the withstand voltage value of the capacitor C-1, the detection terminal pair and the capacitor C-1 together form a current loop, in which the current flows. Then, the current in the loop where the detection terminal pair (the detection terminal 20D-1 and the detection terminal 20D-2) and the capacitor C-1 are located is detected, so as to obtain the primary detection current value Ia. Then, the primary detection current value Ia is compared with the first current threshold ho. If the primary detection current value Ia is smaller than or equal to the first current threshold ho, it is determined that the capacitor is normal; and if the primary detection current value Ia is greater than the first current threshold ho, it is determined that the capacitor is abnormal.

The process of determining whether the capacitor is normal is the same as that described in the embodiment of FIG. 5, the detection result depends upon specific circumstances such as the number of capacitors electrically connected to the detection terminal pair, and whether the capacitors connected to the detection terminal pair belong to a same flexible circuit daughter board or belong to different flexible circuit daughter boards. For example, in a first embodiment, one detection terminal pair is electrically connected to one capacitor. If the primary detection current value is greater than the first current threshold, it is determined that the capacitor is abnormal. During such a detection, it can be determined that the flexible circuit daughter board detected by the detection terminal group is abnormal, so as to monitor the performance of the flexible circuit board. In a second embodiment, one detection terminal pair is electrically connected to multiple capacitors in one flexible circuit daughter board. If the primary detection current value is greater than the first current threshold, it is determined that the multiple capacitors include at least one abnormal capacitor, and it is also determined that the flexible circuit daughter board detected by the detection terminal group is abnormal. In a third embodiment, one detection terminal group is used to detect multiple flexible circuit daughter boards, and one detection terminal pair is electrically connected to the capacitors of different flexible circuit daughter boards. In this case, if the primary detection current value is greater than the first current threshold, it can be determined that the capacitors include at least one abnormal capacitor, but it cannot determine which flexible circuit daughter board includes the abnormal capacitor. For the third embodiment, the present disclosure provides another detection method for detecting which flexible circuit daughter board includes the abnormal capacitor, so as to determine the abnormal flexible circuit daughter board and improve the product yield. Such a detection method is described in the following specific embodiments.

The flexible circuit mother board provided by this embodiment of the present disclosure can be detected by any of the above-mentioned detection methods, so as to determine a defect such as small cracks of the capacitor in the flexible circuit daughter boards before ready for delivery, thereby improving the quality monitoring level and improving the product quality.

For example, each flexible circuit daughter board 10 includes p capacitors C, where p is an integer, and p≥2. The p capacitors of each flexible circuit daughter board 10 are arranged in the same manner. Then, the p capacitors include a first capacitor, a second capacitor . . . , and a $p^{th}$ capacitor. In other words, each flexible circuit daughter board includes a plurality of capacitors. In one flexible circuit mother board, a plurality of flexible circuit daughter boards 10 are manufactured at the same time, and each flexible circuit daughter board 10 can form a flexible circuit board having the same configuration. The p capacitors in one flexible circuit daughter board 10, when being assembled into a module structure, have different uses, and thus each capacitor has its fixed position in one flexible circuit daughter board, and the p capacitors are arranged in the flexible circuit daughter board in a fixed manner. In the present disclosure, when it refers to that the p capacitors in each flexible circuit daughter board 10 are arranged in the same manner, it means that, for the difference flexible circuit daughter boards 10 belonging to a same flexible circuit mother board, the capacitors are arranged at the same relative positions in each flexible circuit daughter board.

Figure 7:
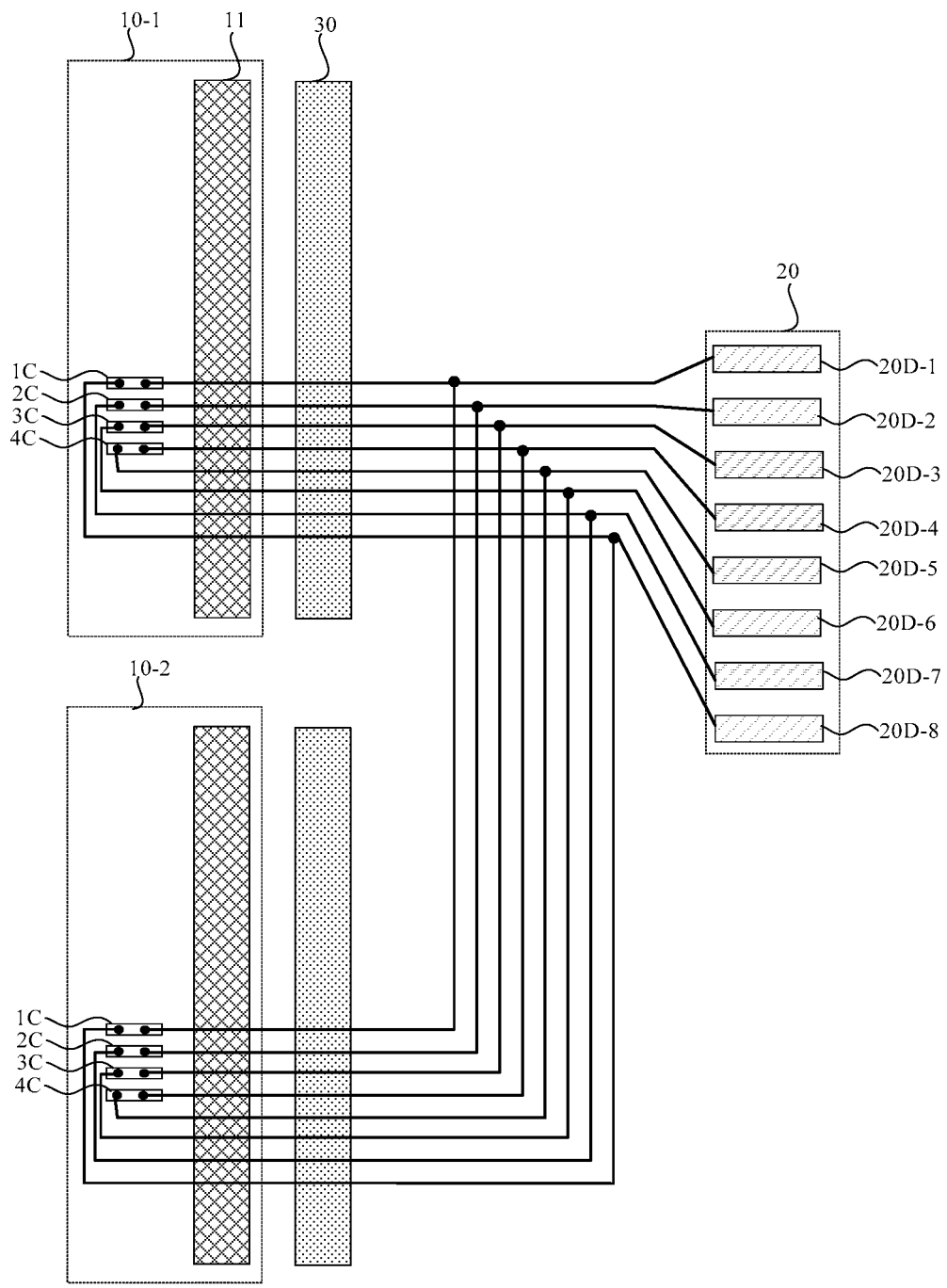
FIG. 7 is another partial schematic diagram of a flexible circuit mother board according to an embodiment of the present disclosure.

One detection terminal group is used to detect n flexible circuit daughter boards, where n is a positive integer and n≥2. Each of the n flexible circuit daughter boards includes a $q^{th}$ capacitor, where q is a positive integer and q≤p. The first electrode plate of each $q^{th}$ capacitor is electrically connected to a same detection terminal, and the second electrode plate of each $q^{th}$ capacitor is electrically connected to a same detection terminal. FIG. 7 is another partial schematic diagram of a flexible circuit mother board according to an embodiment of the present disclosure. As shown in FIG. 7, for example, if n=2 and p=4, one detection terminal group 20 is used to detect two flexible circuit daughter boards 10-1 and 10-2. The detection terminals in the detection terminal group 20 include 20D-1, 20D-2, 20D-3 . . . , and 20D-8. The flexible circuit daughter board 10-1 includes a first capacitor 1C, a second capacitor 2C, a third capacitor 3C, and a fourth capacitor 4C. The flexible circuit daughter board 10-2 also includes a first capacitor 1C, a second capacitor 2C, a third capacitor 3C, and a fourth capacitor 4C. In order to illustrate the connection between the first capacitor 1C and the detection terminal, as shown in FIG. 7, one electrode plate of the first capacitor 1C in the flexible circuit daughter board 10-1 is connected to the detection terminal 20D-1, and the other electrode plate of the first capacitor 1C is connected to the detection terminal 20D-8. One electrode plate of the first capacitor 1C in the flexible circuit daughter board 10-2 is connected to the detection terminal 20D-1, and the other electrode plate of the first capacitor 1C is connected to the detection terminal 20D-8. That is, when one detection terminal group is used to detect n flexible circuit daughter boards, n of $q^{th}$ capacitors can be detected using the same detection terminal pair. In above-mentioned embodiment, for example, n=2, p=4, and q=1. In this embodiment, one detection terminal group can be used to detect two or more flexible circuit daughter boards, thereby decreasing the number of detection terminal groups in the motherboard and improving a detection efficiency.

In this embodiment of the present disclosure, one flexible circuit daughter board is detected by one detection terminal group, i.e., one flexible circuit daughter board corresponds to one detection terminal group. However, one detection terminal group can also be used to detect one or more flexible circuit daughter boards. In different detection situations, one detection terminal group may correspond to one flexible circuit daughter board, or one detection terminal group may correspond to two flexible circuit daughter boards, or one detection terminal group may correspond to multiple flexible circuit daughter boards.

In an embodiment, for one flexible circuit daughter board and the detection terminal group corresponding to the flexible circuit daughter board, the detection terminals include a first common terminal, and the first electrode plates of all capacitors in a flexible circuit daughter board are connected to the first common terminal.

Figure 8:
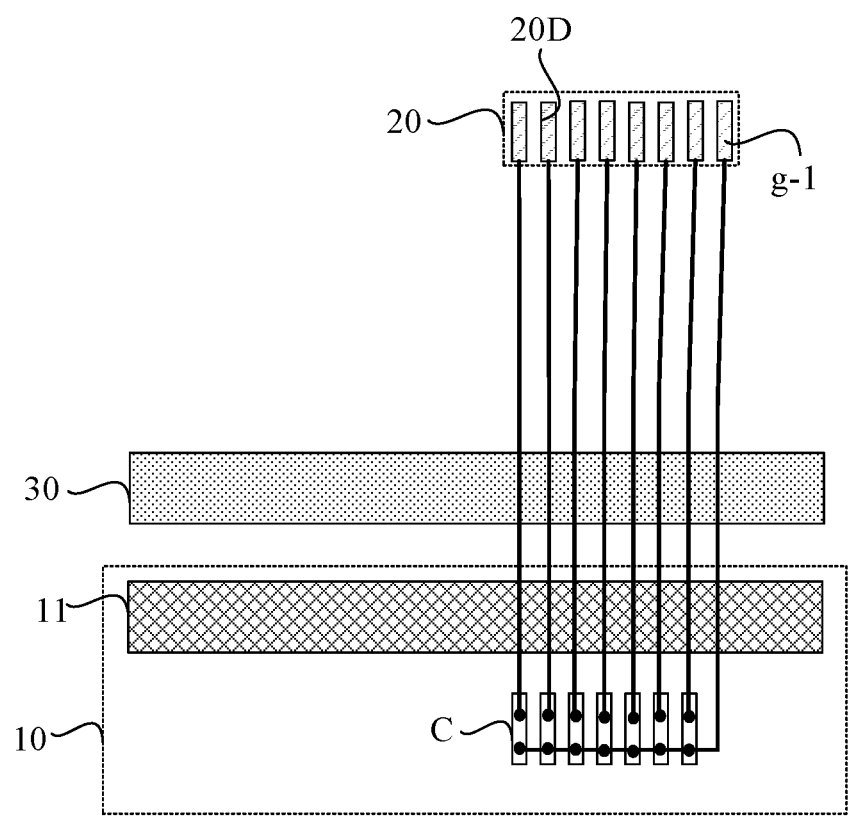
FIG. 8 is another partial schematic diagram of a flexible circuit mother board according to an embodiment of the present disclosure.

In an example, one detection terminal group is used to detect one flexible circuit daughter board, and FIG. 8 is another partial schematic diagram of a flexible circuit mother board according to an embodiment of the present disclosure. As shown in FIG. 8, the first electrode plates of all capacitors C in one flexible circuit daughter board 10 are connected to a first common terminal g-1. The first electrode plate and the second electrode plate are not denoted with reference signs in the figure, which can be understood by referring to the above description. In the figure, the capacitor is schematically shown as a strip shape, which includes an end as the first electrode plate and another end as the second electrode plate.

Figure 9:
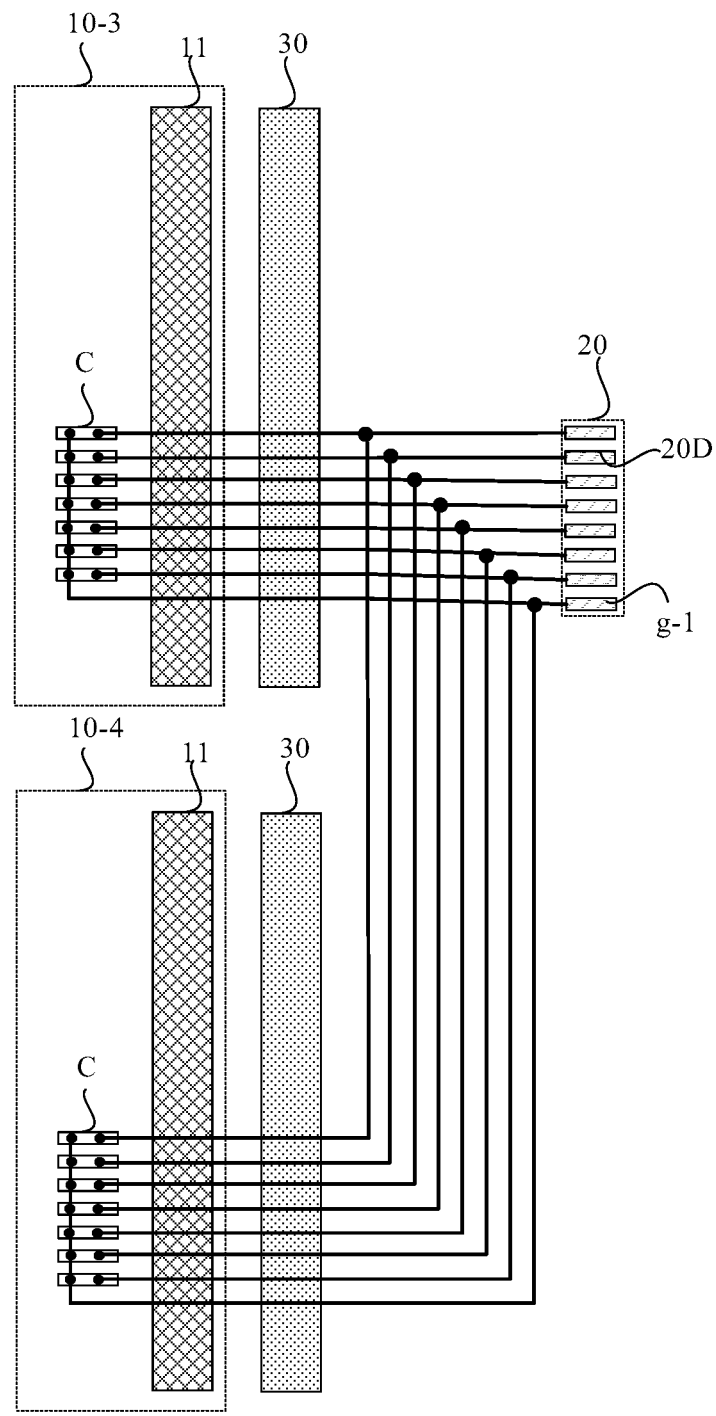
FIG. 9 is another schematic diagram of a flexible circuit mother board according to an embodiment of the present disclosure.

In an example, one detection terminal group is used to detect two or more flexible circuit daughter boards. For example, one detection terminal group is used to detect two flexible circuit daughter boards. FIG. 9 is another schematic diagram of a flexible circuit mother board according to an embodiment of the present disclosure. FIG. 9 illustrates two flexible circuit daughter boards 10-3 and 10-4, and the first electrode plates of all capacitors C in the flexible circuit daughter board 10-3 and the flexible circuit daughter board 10-4 are connected to a same first common terminal g-1.

In the above embodiments, one same detection terminal group is used to detect the first electrode plates of all capacitors in one or more flexible circuit daughter boards, and the capacitors are all connected to a same first common terminal. During the detection, the first common terminal and another detection terminal are combined to form a detection terminal pair. When the detection terminal pair is connected to a constant voltage source, the first common terminal is grounded and the other detection terminal is connected to a constant voltage. This implementation manner can reduce the number of detection terminals in the detection terminal group and the number of connection wires in the flexible circuit mother board, thereby saving space in the flexible circuit mother board and simplifying layout of connection wires in the flexible circuit mother board.

Further, for the flexible circuit daughter board and the detection terminal group corresponding to the flexible circuit daughter board, the detection terminals include at least one second common terminal. One second common terminal is connected to the second electrode plates of m capacitors in a same flexible circuit daughter board, where m is a positive integer and p≥m≥2.

Figure 10:
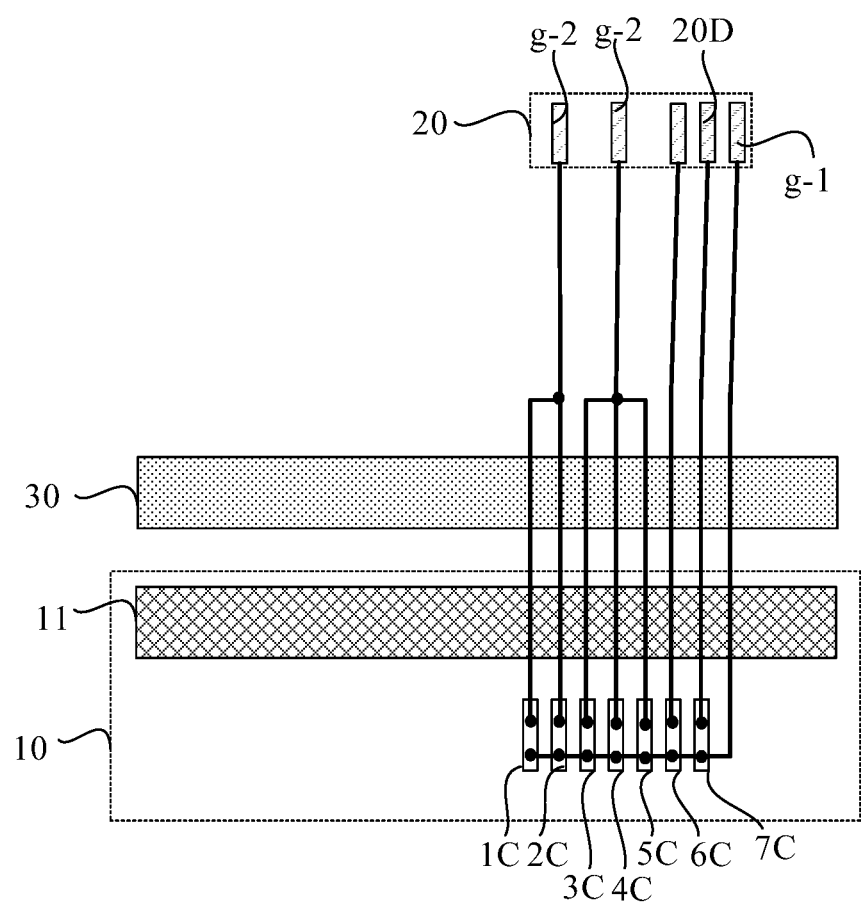
FIG. 10 is another schematic diagram of a flexible circuit mother board according to an embodiment of the present disclosure.

In an example, one detection terminal group is used to detect one flexible circuit daughter board. FIG. 10 is another schematic diagram of a flexible circuit mother board according to an embodiment of the present disclosure. As shown in FIG. 10, for example, one flexible circuit daughter board includes seven capacitors, i.e., p=7. The seven capacitors are a first capacitor 1C, a second capacitor 2C, a third capacitor 3C . . . , and a seventh capacitor 7C. The first electrode plates of the seven capacitors are all connected to a same first common terminal g-1. The second electrode plates of the first capacitor 1C and the second capacitor 2C are connected to a same second common terminal g-2. The second electrode plates of the third capacitor 3C, the fourth capacitor 4C and the fifth capacitor 5C are connected to a same second common terminal g-2. The second electrode plates of the sixth capacitor 6C and the seventh capacitor 7C are connected to detection terminals 20D, respectively.

Figure 11:
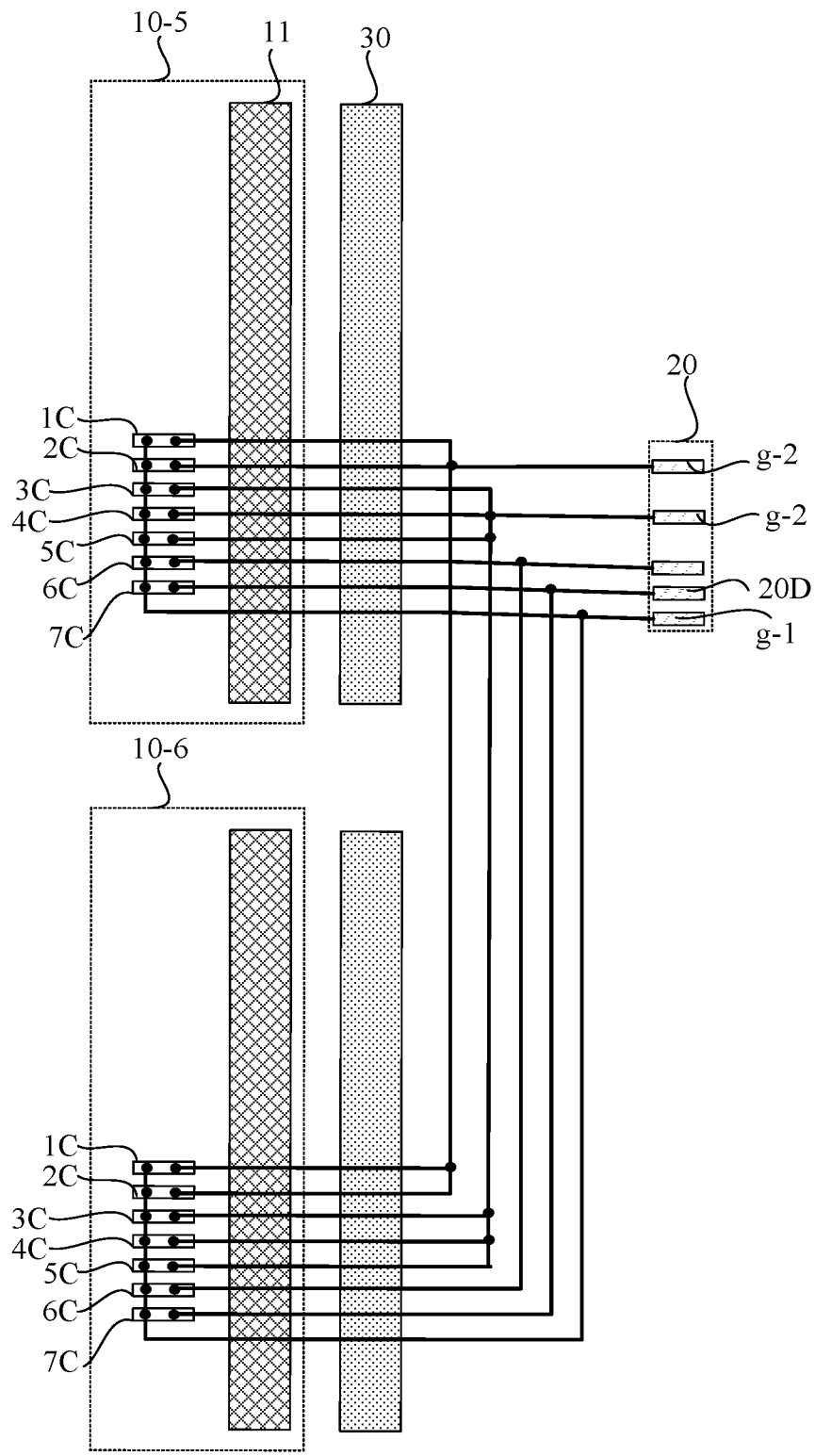
FIG. 11 is another schematic diagram of a flexible circuit mother board according to an embodiment of the present disclosure.

In an example, one detection terminal group is used to detect two or more flexible circuit daughter boards. FIG. 11 is another schematic diagram of a flexible circuit mother board according to an embodiment of the present disclosure. For example, one detection terminal group is used to detect two flexible circuit daughter boards, and in FIG. 11, two flexible circuit daughter boards 10-5 and 10-6 are illustrated. Each of the flexible circuit daughter board 10-5 and the flexible circuit daughter board 10-6 includes seven capacitors shown in FIG. 11. The first electrode plates of all capacitors in the flexible circuit daughter boards 10-5 and 10-6 are connected to a same first common terminal g-1. The second electrode plates of the first capacitor 1C and the second capacitor 2C are connected to a same second common terminal g-2. The second electrode plates of the third capacitor 3C, the fourth capacitor 4C and the fifth capacitor 5C are connected to a same second common terminal g-2. The second electrode plates of the sixth capacitor 6C and the seventh capacitor 7C are respectively connected to detection terminals 20D.

In the embodiments described above, the detection terminal group includes the second common terminal. In the embodiment that one detection terminal group is used to detect one flexible circuit daughter board, one second common terminal is electrically connected to at least two capacitors. A specific connection manner thereof can be selected according to the characteristics of the capacitor and a design function of the capacitor. When one detection terminal group is used to detect two or more flexible circuit daughter boards, one second common terminal is electrically connected to a plurality of capacitors in different flexible circuit daughter boards. During detection, the second common terminal and the first common terminal are combined to form a detection terminal pair. When the detection terminal pair is connected to a constant voltage source, the first common terminal is grounded and the second common terminal is connected to a constant voltage. This implementation manner can further reduce the number of detection terminals in the detection terminal group, and can also reduce the number of connection wires in the flexible circuit mother board, thereby saving space in the flexible circuit mother board and simplifying layout of connection wires in the flexible circuit mother board.

In this embodiment of the present disclosure, the capacitors electrically connected to the same second common terminal has the same withstand voltage value. The second electrode plates of the capacitors having the same withstand voltage value are connected to the same second common terminal. When detecting the flexible circuit mother board, the first common terminal and the second common terminal are combined to form a detection terminal pair, and after the constant voltage source is connected, the performance of the capacitors electrically connected to the second common terminal can be detected. When the primary detection current value is greater than the first current threshold, it is determined that there is an abnormal capacitor. Meanwhile, this implementation manner can further decrease the number of detection terminals in the detection terminal group, and can also decrease the number of connection wires in the flexible circuit mother board, thereby saving space in the flexible circuit mother board and simplifying layout of connection wires in the flexible circuit mother board.

Further, the flexible circuit mother board further includes a plurality of detachable resistors. Among the m capacitors electrically connected to a same second common terminal, one capacitor corresponds to one detachable resistor, and the second electrode plate of the capacitor is electrically connected to the second common terminal through the detachable resistor.

Figure 12:
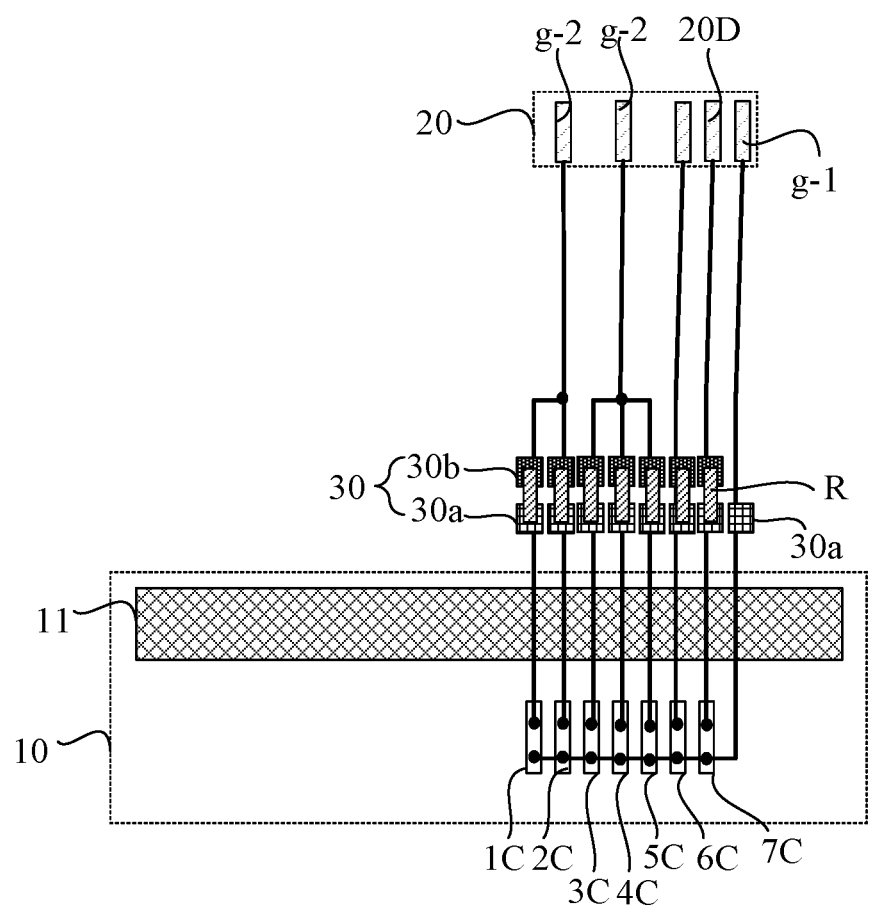
FIG. 12 is another schematic diagram of a flexible circuit mother board according to an embodiment of the present disclosure.

In an embodiment, for example, one detection terminal group is used to detect one flexible circuit daughter board. FIG. 12 is another schematic diagram of a flexible circuit mother board according to an embodiment of the present disclosure. FIG. 12 illustrates that the flexible circuit daughter board 10 includes seven capacitors, and the seven capacitors are connected to the detection terminals in the manner shown in FIG. 10. Each of the first capacitor 1C and the second capacitor 2C electrically connected to the same second common terminal g-2 corresponds to one detachable resistor R, and the second electrode plates of the first capacitor 1C and the second capacitor 2C are electrically connected to the second common terminal g-2 through the respective detachable resistors R. Similarly, each of the third capacitor 3C, the fourth capacitor 4C, and the fifth capacitor 5C corresponds to one detachable resistor R. The detachable resistor R is detachable, and can be removed based on the detection requirements during a detection process of the flexible circuit mother board. FIG. 12 also illustrates that the sixth capacitor 6C and the seventh capacitor 7C are also each electrically connected to the detection terminal 20D through a respective one detachable resistor R. In an example, in an embodiment in which one detection terminal group 20 is used to detect one flexible circuit daughter board 10, when the second electrode plates of the capacitors are connected to the detection terminals in one-to-one correspondence, the detachable resistor may be not provided between the second electrode plates of the capacitors and the detection terminals. That is, the sixth capacitor 6C and the seventh capacitor 7C may be electrically connected to the detection terminals 20D, respectively, without using the detachable resistor R, and this case will not be illustrated herein.

Figure 13:
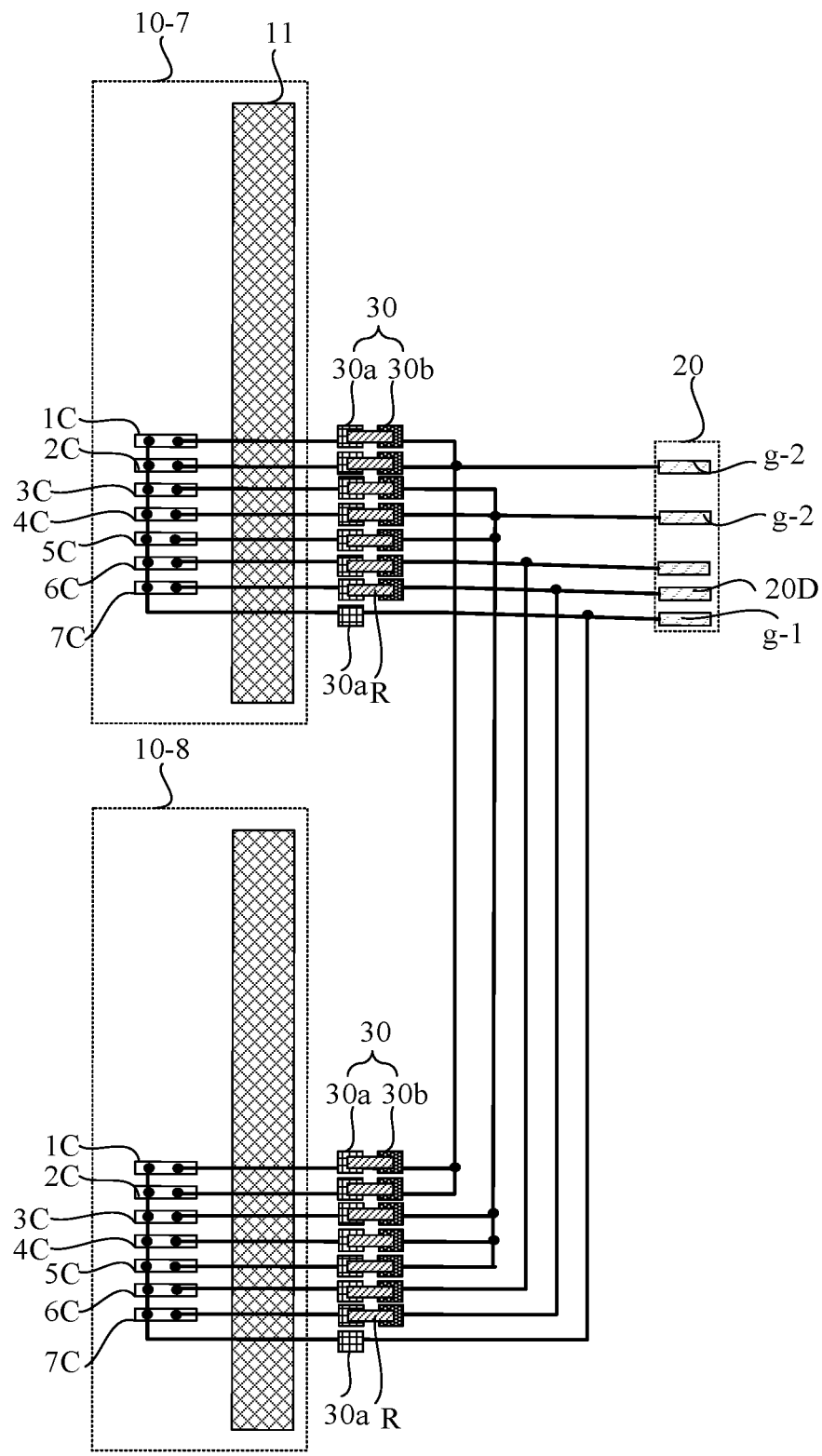
FIG. 13 is another schematic diagram of a flexible circuit mother board according to an embodiment of the present disclosure.

In another embodiment, one detection terminal group is used to detect two or more flexible circuit daughter boards. FIG. 13 is another schematic diagram of a flexible circuit mother board according to an embodiment of the present disclosure. For example, one detection terminal group is used to detect two flexible circuit daughter boards, and in FIG. 13, two flexible circuit daughter boards 10-7 and 10-8 are illustrated. Each flexible circuit daughter board includes seven capacitor, and the seven capacitors are connected to the detection terminals in the same manner as shown in FIG. 10. In this embodiment, each capacitor is electrically connected to the detection terminal through a respective one detachable resistor R. During the detection process of the flexible circuit mother board, when it is determined that there is an abnormal capacitor, the respective detachable resistors R can be removed to determine which capacitor is abnormal. The application of the detachable resistor during the detection process will be described in the following.

The flexible circuit mother board provided by the above-mentioned embodiments corresponding to FIG. 12 and FIG. 13 can be detected using the detection method provided by the embodiment corresponding to FIG. 5 or FIG. 6.

Figure 14:
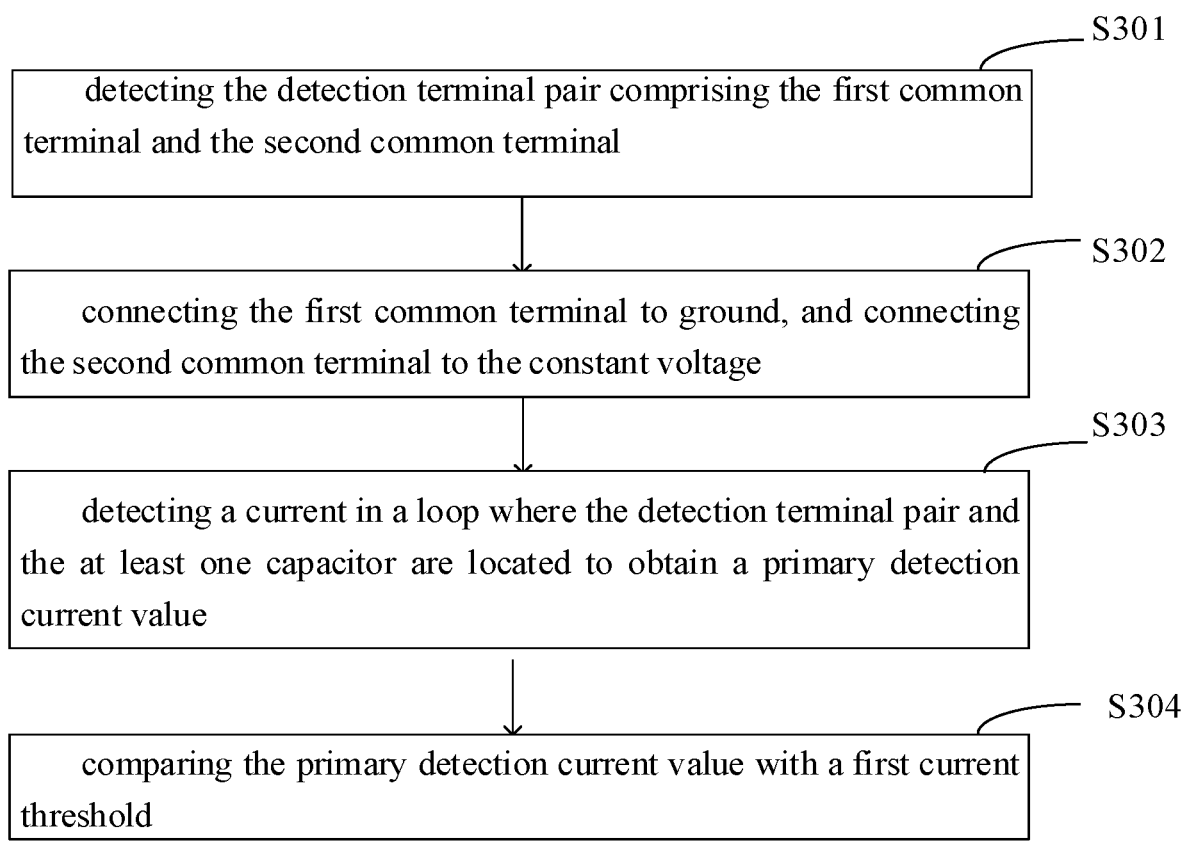
FIG. 14 is a flow chart of another detection method of a flexible circuit mother board according to an embodiment of the present disclosure.

In an example, when the detection method corresponding to FIG. 5 is used for detection, the above-mentioned steps S101 to S104 are performed in sequence. FIG. 14 is a flow chart of another detection method of a flexible circuit mother board according to an embodiment of the present disclosure. As shown in FIG. 14, the detection method includes following steps.

At step S301, the first common terminal and the second common terminal are combined to form a detection terminal pair for detection.

At step S302, the first common terminal is grounded, and the second common terminal is connected to a constant voltage.

At a step S303, a current in the loop where the detection terminal pair and the capacitor are located is detected, to obtain a primary detection current value.

At a step S304, the primary detection current value is compared with the first current threshold.

In the step S304 of comparing the primary detection current value with the first current threshold, the magnitude of the first current threshold is related to the loop formed by the detection terminal pair and the capacitor. In the embodiment corresponding to FIG. 12, in which one detection terminal group is used to detect one flexible circuit daughter board, the second common terminal is connected to two or more capacitors in one flexible circuit daughter board, and the capacitors connected to the same second common terminal are connected in parallel. Then the first current threshold is calculated based on the parallel circuit. In the embodiment corresponding to FIG. 13, in which one detection terminal group is used to detect two or more flexible circuit daughter boards, the first current threshold is a sum of the current thresholds of the corresponding capacitors in the flexible circuit daughter boards. The corresponding capacitors refer to the capacitors in the flexible circuit daughter boards that are electrically connected to the same detection terminal pair.

Figure 15:
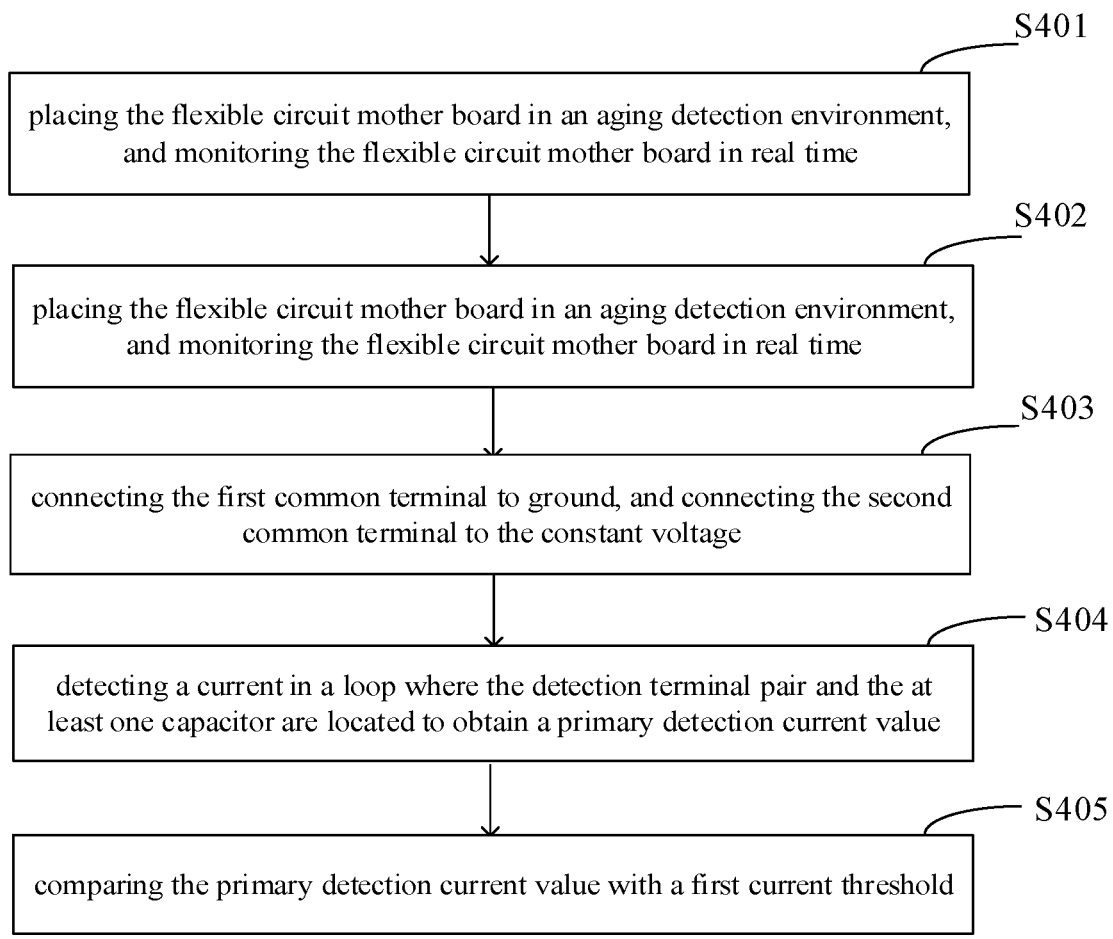
FIG. 15 is a flow chart of another detection method of a flexible circuit mother board according to an embodiment of the present disclosure.

In an example, when the detection method in the embodiment corresponding to FIG. 6 is used for detection, the above-mentioned steps S201 to S205 are performed in sequence. FIG. 15 is a flow chart of another detection method of a flexible circuit mother board according to an embodiment of the present disclosure. As shown in FIG. 15, the detection method includes following steps.

At step S401, the flexible circuit mother board is placed in an aging detection environment, and the flexible circuit mother board is monitored in real time.

At step S402, the first common terminal and the second common terminal are combined to form a detection terminal pair for detection.

At step S403, the first common terminal is grounded, and the second common terminal is connected to a constant voltage.

At step S404, a current in the loop where the detection terminal pair and the capacitor are located is detected, so as to obtain a primary detection current value.

At step S405, the primary detection current value is compared with the first current threshold.

In the step S405 of comparing the primary detection current value with the first current threshold, the magnitude of the first current threshold is related to the loop formed by the detection terminal pair and the capacitor. In the embodiment corresponding to FIG. 12, in which one detection terminal group is used to detect one flexible circuit daughter board, the second common terminal is connected to two or more capacitors in one flexible circuit daughter board, and the capacitors connected to a same second common terminal are connected in parallel. Then the first current threshold is calculated based on the parallel circuit. In the embodiment corresponding to FIG. 13, in which one detection terminal group is used to detect two or more flexible circuit daughter boards, the first current threshold is a sum of the current thresholds in the corresponding capacitors in the flexible circuit daughter boards. Here, the corresponding capacitors refer to the capacitors in the flexible circuit daughter boards that are electrically connected to the same detection terminal pair.

In an example, the flexible circuit mother board provided by the embodiment corresponding to FIG. 12 is detected using the detection method provided by the embodiment corresponding to FIG. 14. During detection, first based on the step S301, the two detection terminals electrically connected to the first electrode plates and the second electrode plates of the capacitor in the detection terminal group 20 are combined to form a detection terminal pair for detection. For example, the second common terminal g-2 connected to the second electrode plates of the first capacitor 1C and the second capacitor 2C, and the first common terminal g-1 are combined to form a detection terminal pair for detection.

In the step S302, the first common terminal g-1 is grounded, and the second common terminal g-2 is connected to a constant voltage. A voltage value of the constant voltage is greater than the withstand voltage value of the first capacitor 1C and the second capacitor 2C.

Then, based on the step S303, a current value in the loop where the detection terminal pair, the first capacitor 1C and the second capacitor 2C are located are detected, so as to obtain the primary detection current value Ia. In this embodiment of the present disclosure, the first capacitor 1C and the second capacitor 2C are each electrically connected to the second common terminal g-2 through the detachable resistors R, and thus the above-mentioned loop further includes two detachable resistors R. For brevity, the loop including the first capacitor 1C, the second capacitor 2C, the two detachable resistors R, the first common terminal g-1 and the second common terminal g-2 is referred as to as a loop HL1.

Then, in the step S304, the primary detection current value Ia obtained in the previous step is compared with the first current threshold ho. In this detection step, the magnitude of the first current threshold $I_1o$ is related to a connection manner in which the components are connected in the loop HL1. In the loop HL1, the first capacitor 1C and one detachable resistor R are connected in series, and the second capacitor 2C and one detachable resistor R are connected in series, then the two series circuits are connected in parallel. When both the first capacitor 1C and the second capacitor 2C are in normal operation, an approximate current value, i.e., the first current threshold ho, in the loop HL1, can be calculated based on Ohm's law. If the primary detection current value Ia is smaller than or equal to the first current threshold ho, it is determined that both the first capacitor 1C and the second capacitor 2C are normal; and if the primary detection current value Ia is greater than the first current threshold $I_1o$, it is determined that the first capacitor 1C and the second capacitor 2C include at least one abnormal transistor.

Similarly, when the flexible circuit mother board provided by the embodiment corresponding to FIG. 13 is detected using the detection method provided by the embodiment corresponding to FIG. 14, one detection terminal pair is used to detect a plurality of capacitors in multiple flexible circuit daughter boards. The detection method provided by the embodiment corresponding to FIG. 14 can eventually detect that there is an abnormal capacitor, but it cannot determine which flexible circuit daughter board includes an abnormal capacitor.

When one detection terminal pair is used to detect two or more capacitors in one flexible circuit daughter board, or when one detection terminal pair is used to detect multiple capacitors in two or more flexible circuit daughter boards, if the detection method provided by the embodiment corresponding to FIG. 15 is used for detection, it is possible in step S405 that it is determined there is at least one abnormal capacitor, but cannot determine which capacitor is abnormal or which flexible circuit daughter board includes the abnormal capacitor.

Based on the above problems, an embodiment of the present disclosure further provides a detection method. In the embodiment that two or more capacitors are connected to a same second common terminal, when it is determined that the capacitors include abnormal capacitor, it can eventually determine which capacitor is abnormal or which flexible circuit daughter board includes an abnormal capacitor.

Figure 16:
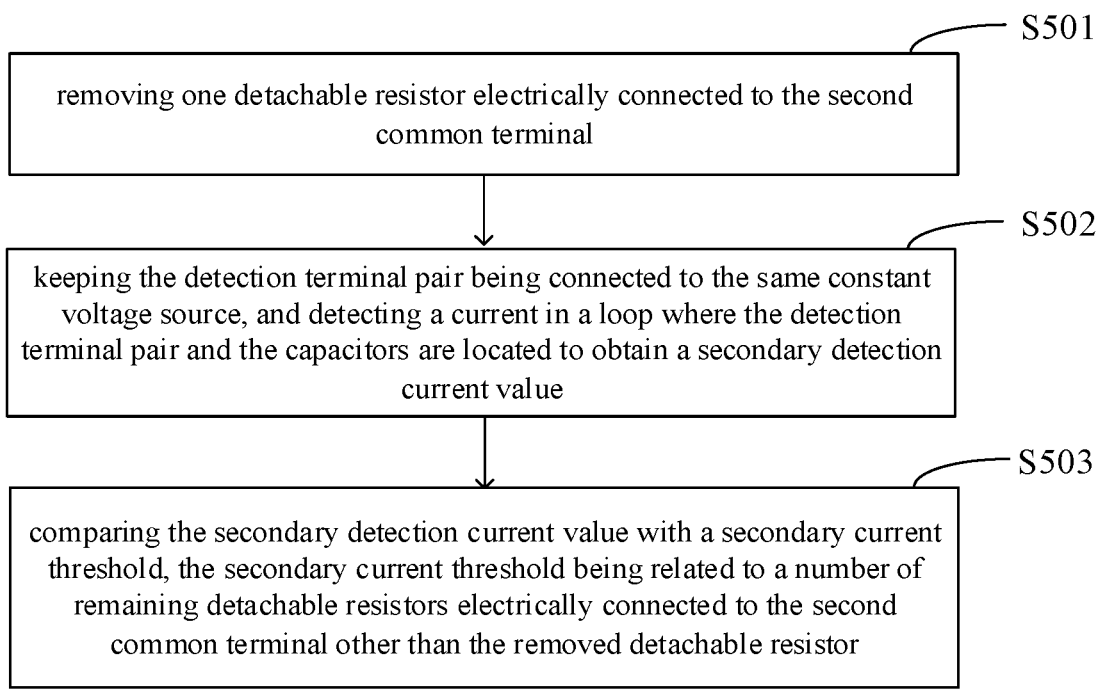
FIG. 16 is a flow chart of yet another detection method of a flexible circuit mother board according to an embodiment of the present disclosure.

FIG. 16 is a flow chart of another detection method of a flexible circuit mother board according to an embodiment of the present disclosure. In an embodiment, if the primary detection current value is greater than the first current threshold, it is determined that the capacitors include an abnormal capacitor. As shown in FIG. 16, the detection method further includes following steps.

At step S501, one detachable resistor electrically connected to the second common terminal is removed. Since the second electrode plate of the capacitor is connected to the second common terminal through the detachable resistor, when one detachable resistor is removed, the capacitor previously connected to the second common terminal through the removed detachable resistor is no longer connected to the second common terminal.

At step S502, the detection terminal pair is kept to be connected to the same constant voltage source, and a current in the loop where the detection terminal pair and the capacitors are located is detected, so as to obtain a secondary detection current value. After one detachable resistor is removed in the step S501, the capacitor previously connected to the second common terminal through the removed detachable resistor is no longer connected to the second common terminal. Thus, the number of capacitors of the loop where the detection terminal pair and the capacitors are located is reduced, and the corresponding current will change.

At step S503, the secondary detection current value is compared with a secondary current threshold, which is related to the number of the remaining detachable resistors electrically connected to the second common terminal other than the removed detachable resistor. If the secondary detection current value is smaller than or equal to the secondary current threshold, it is determined that the capacitor electrically connected to the removed detachable resistor is abnormal; and if the secondary detection current value is greater than the secondary current threshold, it is determined that the capacitor electrically connected to the removed detachable resistor is normal.

After one detachable resistor is removed, the number of capacitors in the loop where the detection terminal pair and the capacitors are located is reduced and thus the current threshold in the corresponding detection loop is only related to the remaining capacitors that are still electrically connected to the detection terminal pair.

If the secondary detection current value is smaller than or equal to the secondary current threshold, it indicates that all capacitors in the loop where the detection terminal and the capacitors are located are normal, and the remaining capacitors in the loop that are connected to the detection terminal pair are normal. Then it is determined that the capacitor electrically connected to the removed detachable resistor is abnormal.

If the secondary detection current value is greater than the secondary current threshold, it indicates that the capacitors still include an abnormal capacitor in the loop where the detection terminal is located, and it is determined that the capacitor electrically connected to the removed detachable resistor is normal. In this case, the above-mentioned steps S501 to S503 can be performed repeatedly until it is detected that the secondary detection current value is smaller than or equal to the secondary current threshold, to determine that the capacitor electrically connected to the removed detachable resistor is abnormal. In this way, the abnormal capacitor can be found.

The flexible circuit mother board is detected using the detection method provided by the embodiment corresponding to FIG. 14 or FIG. 15. If the primary detection current value is greater than the first current threshold, it is determined that the capacitors include an abnormal capacitor, the method provided by the embodiment corresponding to FIG. 16 can be still used to further determine the specific abnormal capacitor.

The flexible circuit mother board provided by the embodiment corresponding to FIG. 12 is detected using the detection method provided by the embodiment corresponding to FIG. 14, and the detection results are as follows. If the primary detection current value Ia is greater than the first current threshold ho, it is determined that the first capacitor 1C and the second capacitor 2C include an abnormal capacitor. The method provided by the embodiment corresponding to FIG. 16 is continuously performed to find the abnormal capacitor. First, in the step S501, one detachable resistor R electrically connected to the second common terminal g-2 is removed, for example, the detachable resistor R electrically connected to the first capacitor 1C is removed. Then, in the step S502, the detection terminal pair (the second common terminal g-2 and the first common terminal g-1) are connected to the same constant voltage source, i.e., the constant voltage source that is turned on at the step S302), and a current in a loop where the detection terminal pair and the capacitor are located is detected to obtain a secondary detection current value Ib. In step S503, the secondary detection current value Ib is compared with the secondary current threshold 120. If the secondary detection current value Ib is smaller than or equal to the secondary current threshold 120, it is determined that the first capacitor 1C electrically connected to the removed detachable resistor is abnormal; and if the current value Ib is greater than the secondary current threshold 120, it is determined that the first capacitor 1C electrically connected to the removed detachable resistor is normal, and thus the second capacitor 2C is abnormal.

In an embodiment in which one detection terminal group corresponds to one flexible circuit daughter board, as in the embodiment corresponding to FIG. 12, when the detection method provided by the embodiment corresponding to FIG. 16 is used for detection, it can eventually determine which capacitor is the abnormal capacitor in the flexible circuit daughter board to be detected.

In an embodiment that one detection terminal group corresponds to two or more flexible circuit daughter boards, as illustrated in FIG. 13, one second common terminal is electrically connected to multiple capacitors in different flexible circuit daughter boards, the second electrode plate of each capacitor is electrically connected to the second common terminal through a corresponding detachable resistor. When the detection method provided in the embodiment corresponding to FIG. 16 is used for detection, by removing the detachable resistor during detection, it can determine whether the capacitor electrically connected to the removed detachable resistor is abnormal or not. By repeatedly performing the above-mentioned steps S501 to S503, it is eventually determined which flexible circuit daughter board includes an abnormal capacitor and it is also determined which specific capacitor in the flexible circuit daughter board is abnormal.

In this embodiment of the present disclosure, the flexible circuit mother board includes a plurality of detachable resistors. For the m capacitors electrically connected to the same second common terminal, one capacitor corresponds to one detachable resistor, and the second electrode plate of each capacitor is electrically connected to the second common terminal through the detachable resistor. During the detection process, the detachable resistor can be removed to further determine whether the capacitor connected to the removed detachable resistor is abnormal or not, so as to eventually determine a position of the abnormal capacitor or determine the flexible circuit daughter board including an abnormal capacitor. In this way, the defects such as small cracks of the capacitors in the flexible circuit daughter boards can be found before they are ready for delivery, thereby improving the quality monitoring level and improving the product quality.

In the above-mentioned embodiments corresponding to FIG. 12 and FIG. 13, one capacitor corresponds to one detachable resistor, and the second electrode plate of the capacitor is electrically connected to the second common terminal through the detachable resistor. In the flexible circuit mother board provided by this embodiment of the present disclosure, a position of the detachable resistor can also be set in other manners. In a case that one detection terminal group is used to detect two or more flexible circuit daughter boards, if an abnormal capacitor is detected, the detachable resistor can be used to detect and determine which flexible circuit daughter board includes an abnormal capacitor.

For example, the flexible circuit mother board further includes a plurality of detachable resistors. For one flexible circuit daughter board and one detection terminal group corresponding to the flexible circuit daughter board: one detachable resistor corresponds to one detection terminal, and at least one of the first electrode plate and the second electrode plate of the capacitor is electrically connected to the detection terminal through the detachable resistor. Each flexible circuit daughter board includes p capacitors, where p is an integer and p≥2. The p capacitors of each flexible circuit daughter board are arranged in the same manner. The p capacitors include a first capacitor, a second capacitor . . . , and a $p^{th}$ capacitor. One detection terminal group is used to detect at least n flexible circuit daughter boards, where n is a positive integer and n≥2. Each of the n flexible circuit daughter boards include a $q^{th}$ capacitor, where q is a positive integer and q≤p. The first electrode plate or the second electrode plate of the $q^{th}$ capacitor are electrically connected to the same detection terminal through a corresponding detachable resistor.

That is, in a case where one detection terminal group is used to detect n flexible circuit daughter boards, one detection terminal in the detection terminal group will be electrically connected to the capacitors in the n flexible circuit daughter boards. For one flexible circuit daughter board and the detection terminal group corresponding to the flexible circuit daughter board: one detachable resistor corresponds to one detection terminal. That is, for a same detection terminal, each of the n flexible circuit daughter boards corresponds to a respective one detachable resistor electrically connected to the detection terminal. The following embodiment will be schematically illustrated with n=2.

Figure 17:
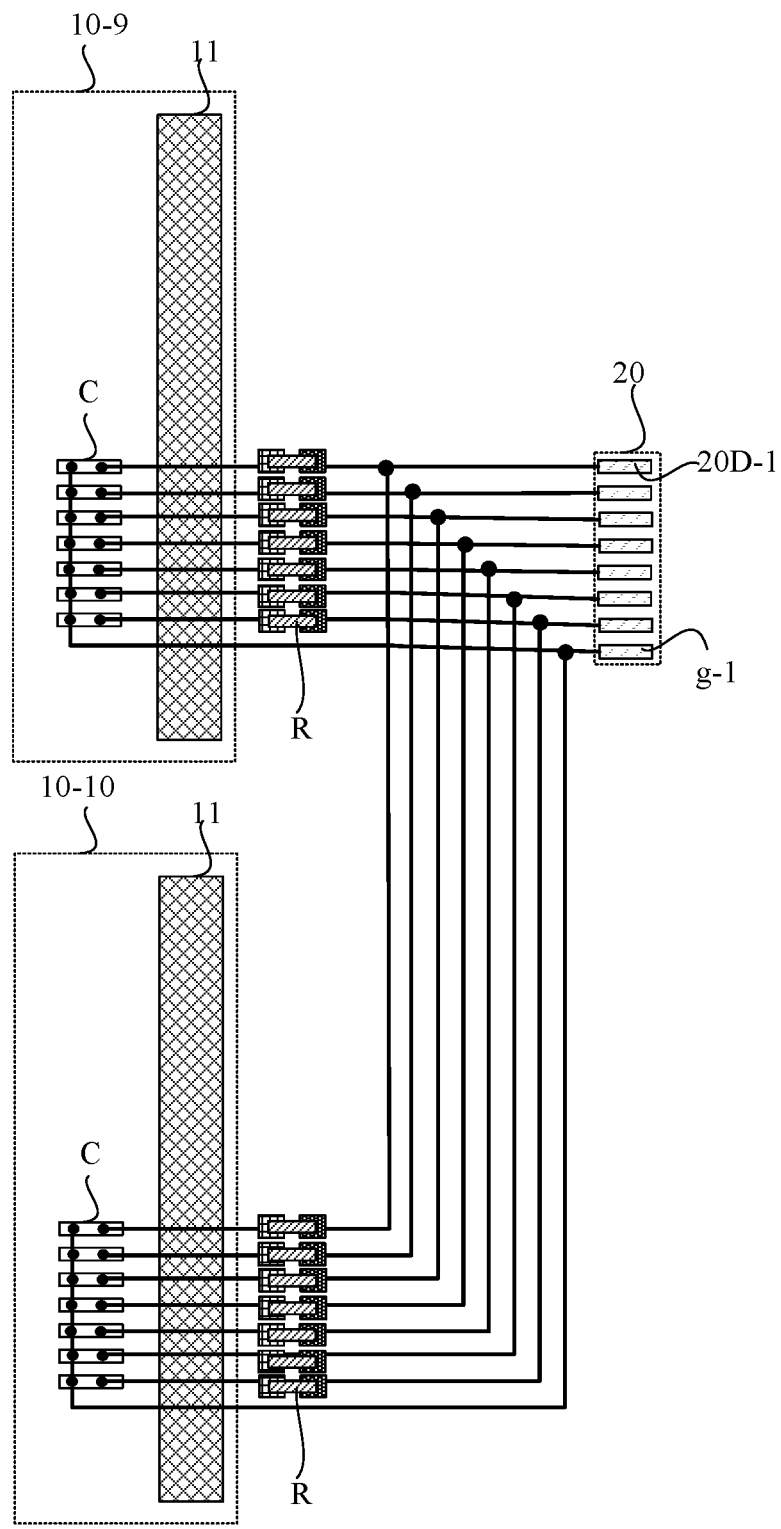
FIG. 17 is another partial schematic diagram of a flexible circuit mother board according to an embodiment of the present disclosure.

FIG. 17 is another partial schematic diagram of a flexible circuit mother board according to an embodiment of the present disclosure. In the embodiment shown in FIG. 17, the flexible circuit daughter boards 10-9 and 10-10 are illustrated. The first electrode plates of all capacitors in the flexible circuit daughter board 10 are electrically connected to a same first common terminal g-1, and the second electrode plate of each capacitor in the flexible circuit daughter board 10 is electrically connected to one detection terminal 20D through a corresponding detachable resistor R. In this embodiment, one detection terminal group 20 is used to detect two flexible circuit daughter boards 10-9 and 10-10.

Figure 18:
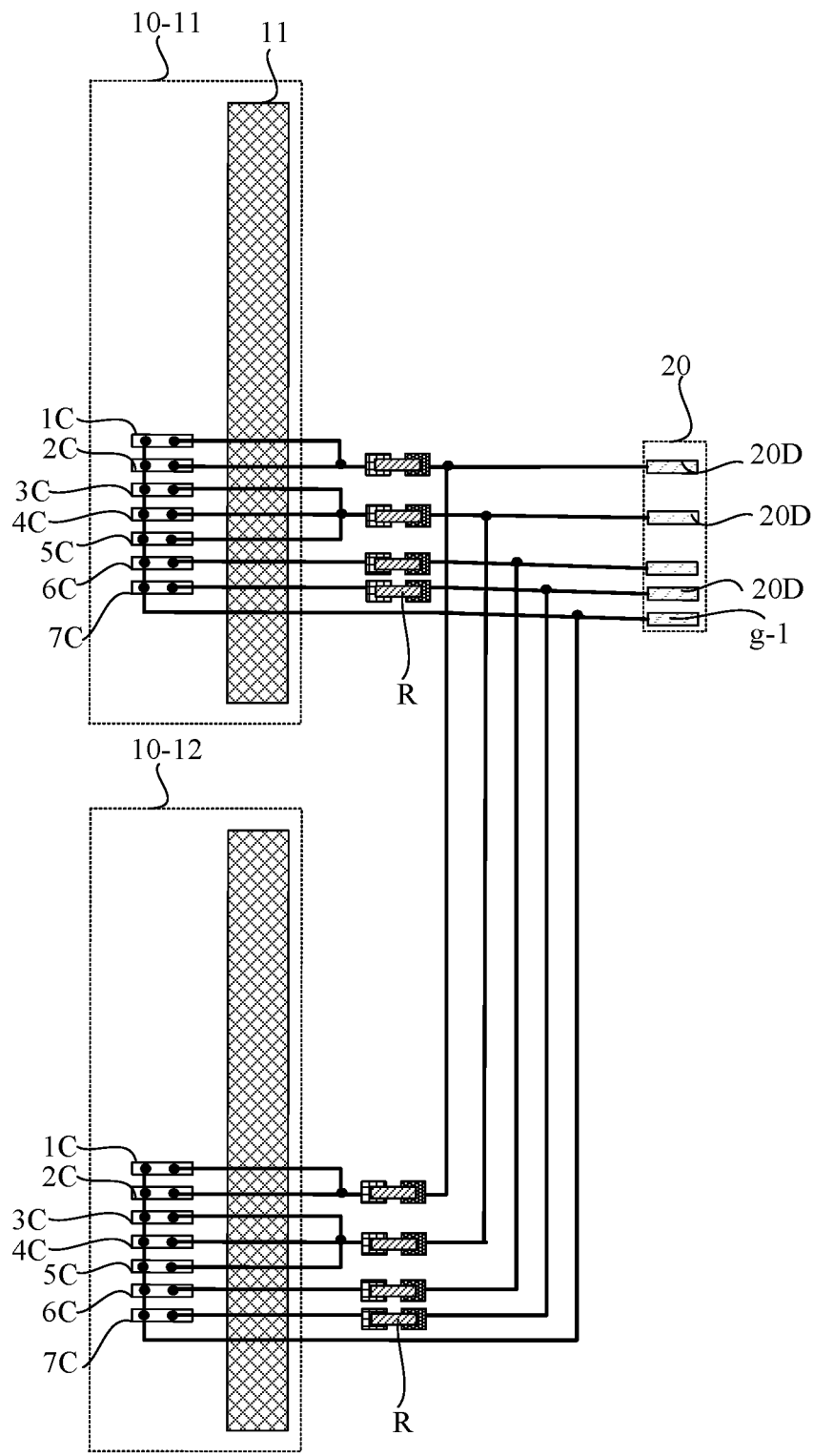
FIG. 18 is another schematic diagram of a flexible circuit mother board according to an embodiment of the present disclosure.

FIG. 18 is another schematic diagram of a flexible circuit mother board according to an embodiment of the present disclosure. In the embodiment shown in FIG. 18, the flexible circuit daughter boards 10-11 and 10-12 are illustrated. The first electrode plates of all capacitors in the flexible circuit daughter board 10 are electrically connected to the same first common terminal g-1, and the second electrode plates of some capacitors in one flexible circuit daughter board 10 are electrically connected to the detection terminal 20D through one detachable resistor R. For example, as shown in the figure, each flexible circuit daughter board includes p capacitors, and p=7. The p capacitors include a first capacitor 1C, a second capacitor 2C, a third capacitor 3C . . . , and a seventh capacitor 7C. For each of the flexible circuit daughter boards 10-11 and 10-12, the second electrode plates of the first capacitor 1C and the second capacitor 2C are electrically connected to one detection terminal 20D through one detachable resistor R; the second electrode plates of the third capacitor 3C, the fourth capacitor 4C, and the fifth capacitor 5C are electrically connected to one detection terminal 20D through one detachable resistor R; and the second electrode plate of each of the sixth capacitor 6C and the seventh capacitor 7C is electrically connected to a detection terminal 20D through one corresponding detachable resistor R.

In the embodiments corresponding to FIG. 17 and FIG. 18, the first electrode plate of the capacitor is electrically connected to the first common terminal without a detachable resistor. In some alternative implementation manners, the first electrode plates of the capacitors in one flexible circuit daughter board are electrically connected to the detection terminal through the detachable resistors, which is not shown herein.

The flexible circuit mother board provided by the embodiments corresponding to FIG. 17 and FIG. 18 can be detected by the detection method provided by the embodiment corresponding to FIG. 5 or FIG. 6.

In the detection process, since one detection terminal group is used to detect two or more flexible circuit daughter boards, when the above-mentioned method is used for detection, one detection terminal pair is used to detect capacitors in different flexible circuit daughter boards. After the detection, it can be obtained that the capacitors detected by the detection terminal pair include an abnormal capacitor. The embodiments corresponding to FIG. 17 or FIG. 18 of the present disclosure further provide a detection method, which can be used to detect which specific flexible circuit daughter board includes an abnormal capacitor.

Figure 19:
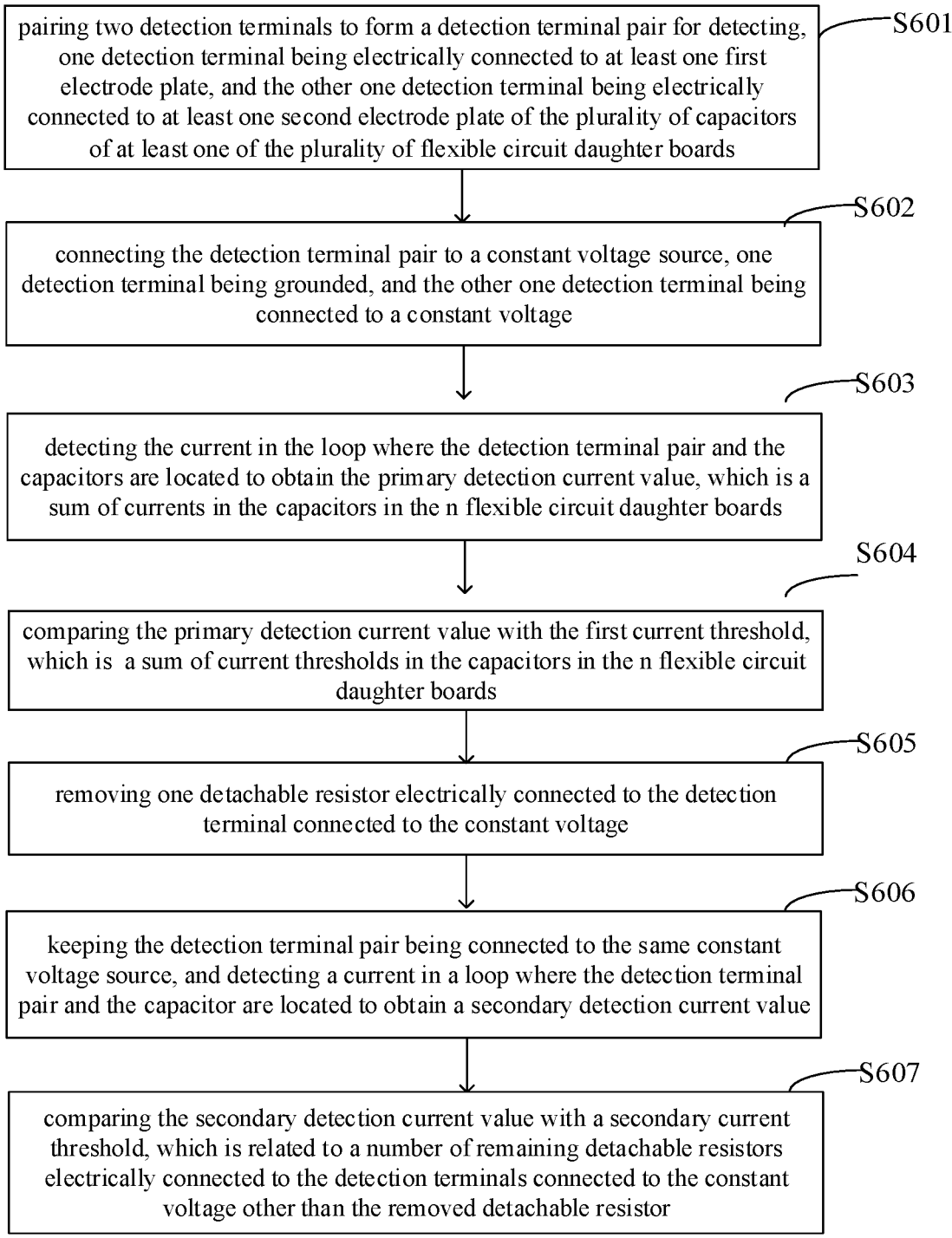
FIG. 19 is a flow chart of yet another detection method of a flexible circuit mother board according to an embodiment of the present disclosure.

FIG. 19 is a flow chart of another detection method of a flexible circuit mother board according to an embodiment of the present disclosure. As shown in FIG. 19, the detection method includes the following steps.

At step S601, a detection terminal pair comprising two detection terminals in the detection terminal group is detected. One detection terminal of the detection terminal pair is electrically connected to at least one first electrode plate of the plurality of capacitors, and the other one detection terminal of the detection terminal pair is electrically connected to at least one second electrode plate of the plurality of capacitors.

At step S602, the detection terminal pair is connected to a constant voltage source, one detection terminal of the detection terminal pair is grounded, and the other one detection terminal of the detection terminal pair is connected to a constant voltage.

At step S603, a current in the loop where the detection terminal pair and the at least one capacitor are located is detected to obtain a primary detection current value, and the primary detection current value is a sum of the currents in the corresponding capacitors in the n flexible circuit daughter boards.

At step S604, the primary detection current value is compared with a first current threshold, which is the sum of the current thresholds in the corresponding capacitors in the n flexible circuit daughter boards. If the primary detection current value is greater than the first current threshold and it is determined that there is an abnormal capacitor, the method further includes the following steps.

At step S605, one detachable resistor electrically connected to the detection terminal connected to the constant voltage is removed.

At step S606, the detection terminal pair is still connected to a same constant voltage source, and a current in the loop where the detection terminal pair and the at least one capacitor are located is detected to obtain a secondary detection current value.

At step S607, the secondary detection current value is compared with a secondary current threshold, which is related to a number of remaining detachable resistors electrically connected to the detection terminals connected to the constant voltage other than the removed detachable resistor. If the secondary detection current value is smaller than or equal to the secondary current threshold, it is determined that the flexible circuit daughter board, to which the capacitor electrically connected to the removed detachable resistor belongs, includes an abnormal capacitor; and if the secondary detection current value is greater than the secondary current threshold, it is determined that each capacitor in the flexible circuit daughter board, to which the capacitor electrically connected to the removed detachable resistor belongs, is normal.

At the step S607, if the secondary detection current value is greater than the secondary current threshold, it is determined that each capacitor in the flexible circuit daughter board, to which the capacitor electrically connected to the removed detachable resistor belongs, is normal, which indicates that there is still an abnormal capacitor in the loop. In this case, the steps S605 to S607 are repeatedly performed until it is detected that the secondary detection current value is smaller than or equal to the secondary current threshold, to determine the abnormal capacitor of the flexible circuit daughter board, to which the capacitor electrically connected to the removed detachable resistor belongs. In this way, the abnormal flexible circuit daughter board can be found.

An embodiment of the present disclosure further provides a dynamic aging detection method, which is used to perform a dynamic aging detection on the flexible circuit mother board, and can also determine an abnormal capacitor caused by the small cracks on the capacitor. The dynamic aging detection method includes the above-mentioned steps S601 to S607, and before the step S601, the method further includes: placing the flexible circuit mother board in an aging detection environment. Moreover, in the dynamic aging detection method, the step S602 includes: connecting one detection terminal of the detection terminal pair to ground, and connecting the other detection terminal of the detection terminal pair to a constant voltage, which has voltage value smaller than or equal to a withstand voltage value of the capacitor electrically connected to the detection terminal.

In an example, the flexible circuit mother board provided by the embodiment corresponding to FIG. 17 is detected using the detection method provided by the embodiment corresponding to FIG. 19, and the detection terminal 20-1 and the first common terminal g-1 are combined to form a detection terminal pair. If it is determined in the step S604 that the primary detection current value is greater than the first current threshold and there is an abnormal capacitor, the steps S605 to S607 are further performed. For example, the detachable resistor R, which is electrically connected to the detection terminal 20-1 and electrically connected to the capacitor C in the flexible circuit daughter board 10-9, is removed, and if the secondary detection current value is still smaller than or equal to the secondary current threshold, then it is determined that the flexible circuit daughter board 10-9 includes an abnormal capacitor; and if the secondary detection current value is greater than the secondary current threshold, it is determined that the flexible circuit daughter board 10-10 is includes an abnormal capacitor.

When the detection method provided by the embodiment corresponding to FIG. 19 is used for detection, by removing the detachable resistor during detection, it is determined whether the flexible circuit daughter board, to which the capacitor electrically connected to the removed detachable resistor belongs, includes an abnormal capacitor or not. By repeatedly performing the above-mentioned steps S605 to S607, it can eventually determine which flexible circuit daughter board includes the abnormal capacitor. In this way, the abnormal flexible circuit daughter board can be found, thereby improving the quality monitoring level and improving the product quality.

With further reference to FIG. 12 or FIG. 13, the external pad group 30 includes a plurality of first pads 30a and a plurality of second pads 30b. The detachable resistor R includes a first end electrically connected to the second electrode plate of the capacitor through the first pad 30a, and a second end electrically connected to the detection terminal through the second pad 30*b*. For example, the detachable resistor R is electrically connected to the first capacitor 1C, the first electrode plate of the first capacitor 1C is connected to the first common terminal g-1, the detachable resistor R is connected to the second electrode plate of the first capacitor 1C through the first pad 30*a*, and the detachable resistor R is electrically connected to the detection terminal g-2 through the second pad 30*b*. The detachable resistor can be removed due to the presence of the first pad and the second pad, so that the flexible circuit mother board provided with the detachable resistors can be detected using the detection method provided by the embodiment corresponding to FIG. 16 or FIG. 19.

In an embodiment, as shown in FIG. 12, the first electrode plate of each capacitor is electrically connected to the detection terminal through the pad (the first pad 30*a* shown in FIG. 12) in the external pad group 30. In another embodiment, the first electrode plate of the capacitor may be electrically connected to the detection terminal not through the pad in the external pad group 30 but only through the connection wire on the flexible circuit mother board, which is not illustrated in the figure herein.

In some alternative embodiments, different from the embodiment corresponding to FIG. 12, the first electrode plate of the capacitor is also electrically connected to the detection terminal through the detachable resistor. That is, each of the first electrode plate and the second electrode plate of the capacitor is electrically connected to the detection terminal through a detachable resistor. This is not illustrated in the figure herein.

Figure 20:
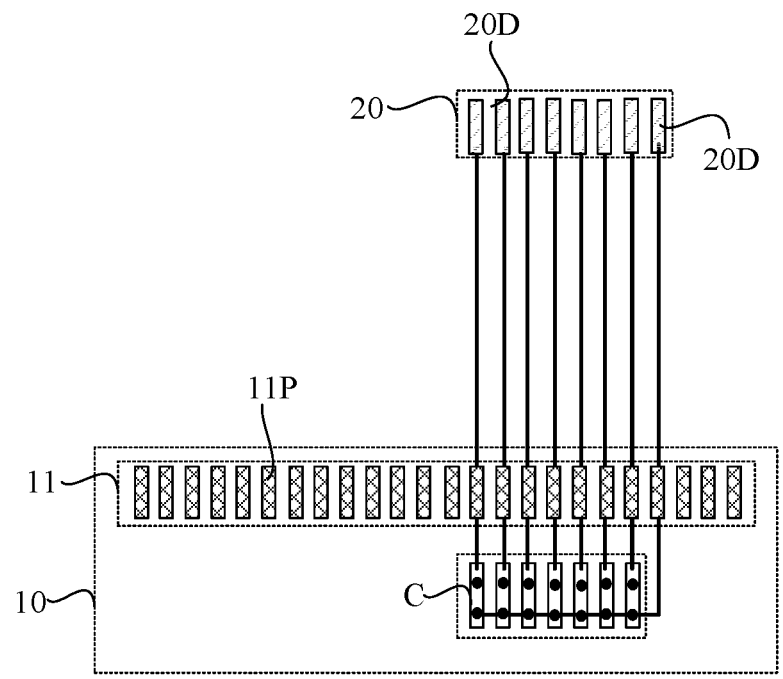
FIG. 20 is a flow chart of yet another detection method of a flexible circuit mother board according to an embodiment of the present disclosure.

FIG. 20 is a flow chart of another detection method of a flexible circuit mother board according to an embodiment of the present disclosure. As shown in FIG. 20, only one flexible circuit daughter board 10 and a detection terminal group 20 connected to the flexible circuit daughter board 10 are illustrated. In one flexible circuit daughter board 10, the bonding pad area 11 is provided with a plurality of bonding pads 11P, the first electrode plate and the second electrode plate of the capacitor C are electrically connected to the bonding pads 11, respectively, and then are further electrically connected to the detection terminals 20D through the bonding pads 11P, respectively. The first electrode plate and the second electrode plate are not illustrated in the figure. In the figure, the capacitor C is schematically shown as a strip shape, and the capacitor C includes an end as the first electrode plate and another end as the second electrode plate. In the flexible circuit daughter board, the capacitor is located in a device area, and the bonding pad is usually located at an edge of the flexible circuit daughter board. When detecting the capacitive performance in the flexible circuit daughter board through the detection terminal group outside the flexible circuit daughter board, the electrode plate of the capacitor is set to be electrically connected to the bonding pad, and then is further connected to the detection terminal through the bonding pad. It is unnecessary to provide an additional connection wire in the bonding pad area to achieve connection between the capacitor plate and the detection terminal, thereby simplifying wiring in the flexible circuit daughter board.

Figure 21:
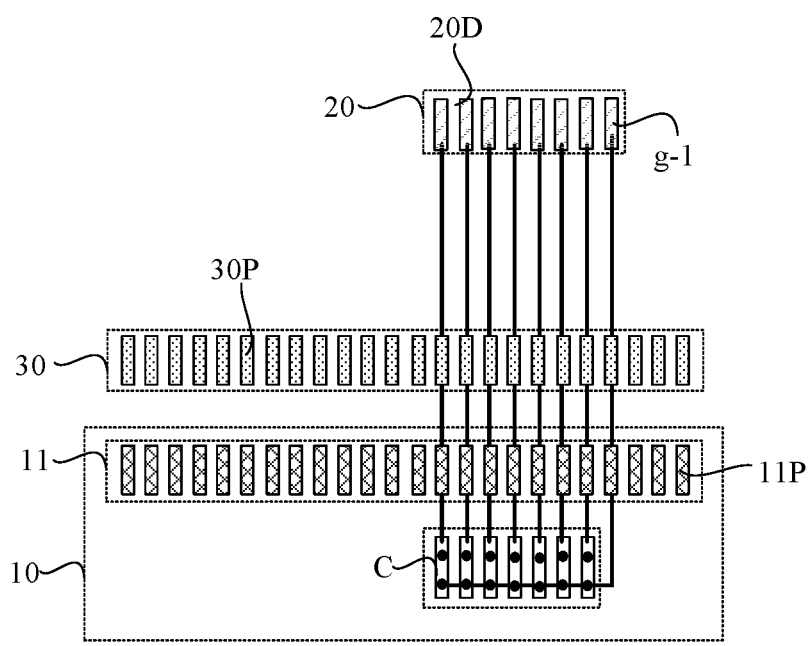
FIG. 21 is another schematic diagram of a flexible circuit mother board according to an embodiment of the present disclosure.

FIG. 21 is another schematic diagram of a flexible circuit mother board according to an embodiment of the present disclosure. In an embodiment, as shown in FIG. 21, only one flexible circuit daughter board 10 and one detection terminal group 20 connected to the flexible circuit daughter board 10 are illustrated. In the flexible circuit daughter board 10 and the external pad group 30 corresponding to the flexible circuit daughter board 10, the external pad group 30 includes a plurality of external pads 30P, and each of the first electrode plate and the second electrode plate of the capacitor C is electrically connected to the detection terminal 20D through a corresponding external pad 30P. In this embodiment, the capacitor C is electrically connected to the detection terminal through the external pad 30P, thereby achieving detection of the capacitive performance in the flexible circuit daughter board using the detection method provided by the embodiment corresponding to FIG. 5 or FIG. 6 with the detection terminal group. Meanwhile, in this embodiment, the external pad 30P can also be used as a detection terminal for detecting whether there is an open circuit, disconnection in the circuit of the flexible circuit daughter board, and for detecting the resistance performance, capacitive performance, and diode performance of the circuit. This embodiment can decrease the number of pads on the flexible circuit mother board, thereby saving space on the flexible circuit mother board.

Further, in this embodiment of the present disclosure, for one flexible circuit daughter board, a surface of each of the plurality of capacitors is coated with a waterproof layer, which can protect the capacitors for their service life. The flexible circuit mother board provided by this implementation manner can be detected using any of the detection methods provided by the embodiments of the present disclosure. Especially for capacitors coated with a waterproof layer in the related art, it is difficult to determine a specific location of an abnormal capacitor during the detection. However, the detection method provided by the embodiment corresponding to FIG. 16 or FIG. 19 described above can be used to provide a detachable resistor in the flexible circuit mother board so as to determine the specific location of the capacitor. In this way, it can improve the quality monitoring level and improving the product quality.

The above-described embodiments are representative embodiments of the present disclosure, but not intended to limit the present disclosure. Any modifications, equivalent substitutions and improvements made within the principle of the present disclosure shall fall into the protection scope of the present disclosure.

Finally, it should be noted that, the above-described embodiments are for illustrating the present disclosure, but not intended to provide any limitations. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A flexible circuit mother board, comprising:
   a plurality of flexible circuit daughter boards;
   at least one detection terminal group; and
   a plurality of external pad groups corresponding to the plurality of flexible circuit daughter boards in one-to-one correspondence,
   wherein each of the plurality of flexible circuit daughter boards has a bonding pad area adjacent to a corresponding one of the plurality of external pad groups,
   wherein each of the at least one detection terminal group detects at least one of the plurality of flexible circuit daughter boards, and each of the at least one detection terminal group comprises a plurality of detection terminals; and wherein each of the plurality of flexible circuit daughter boards comprises a plurality of capacitors, each of the plurality of capacitors comprises a first electrode plate and a second electrode plate, and each of the first electrode plate and the second electrode plate is electrically connected to one of the plurality of detection terminals.

2. The flexible circuit mother board according to claim 1, wherein the plurality of capacitors of each of the plurality of flexible circuit daughter boards comprises p capacitors, where p is an integer and p≥2, and the p capacitors in each of the plurality of flexible circuit daughter boards are arranged in a same manner, and the p capacitors comprise a first capacitor, a second capacitor . . . , and a $p^{th}$ capacitor;

wherein one of the at least one detection terminal group detects n flexible circuit daughter boards of the plurality of flexible circuit daughter boards, where n is a positive integer and n≥2; and wherein each of the n flexible circuit daughter boards comprises a $q^{th}$ capacitor, where q is a positive integer and q≤p; and the first electrode plate of the $q^{th}$ capacitor of each of the n flexible circuit daughter boards is electrically connected to a same one of the plurality of detection terminals, and the second electrode plate of the $q^{th}$ capacitor of each of the n flexible circuit daughter boards is electrically connected to the same one of the plurality of detection terminals.

3. The flexible circuit mother board according to claim 1, wherein, for one of the plurality of flexible circuit daughter boards and one of the at least one detection terminal group corresponding to the flexible circuit daughter board, the plurality of detection terminals comprises a first common terminal, and the first electrode plate of each of the plurality of capacitors of the flexible circuit daughter board is connected to the first common terminal.

4. The flexible circuit mother board according to claim 3, wherein the plurality of capacitors of each of the plurality of flexible circuit daughter boards comprises p capacitors, where p is an integer and p≥2, and the p capacitors comprise a first capacitor, a second capacitor . . . , and a $p^{th}$ capacitor, and wherein for the one of the plurality of flexible circuit daughter boards and the one of the at least one detection terminal group corresponding to the flexible circuit daughter board, the plurality of detection terminals comprises at least one second common terminal, and the second electrode plates of m capacitors of the flexible circuit daughter board are electrically connected to a same one of the at least one second common terminal, where m is a positive integer and p≥m≥2.

5. The flexible circuit mother board according to claim 4, further comprising a plurality of detachable resistors, wherein one of the m capacitors corresponds to one of the plurality of detachable resistors, and the second electrode plate of the one of the m capacitors is electrically connected to the second common terminal through the detachable resistor.

6. The flexible circuit mother board according to claim 4, wherein the m capacitors have a same withstand voltage value.

7. The flexible circuit mother board according to claim 1, wherein, in each of the plurality of the flexible circuit daughter boards, a plurality of bonding pads is provided in the bonding pad area, and the first electrode plates and the second electrode plates of the plurality of capacitors are electrically connected to the plurality of bonding pads, and are further electrically connected to the plurality of detection terminals through the plurality of bonding pads.

8. The flexible circuit mother board according to claim 1, further comprising a plurality of detachable resistors, wherein for one of the plurality of flexible circuit daughter boards and one of the at least one detection terminal group corresponding to the flexible circuit daughter board: one of the plurality of detachable resistors corresponds to one of the plurality of detection terminals, and at least one of the first electrode plate and the second electrode plate of each of the plurality of capacitors of the flexible circuit daughter board is electrically connected to one of the plurality of detection terminals of the detection terminal group through a corresponding one of one of the plurality of detachable resistors.

9. The flexible circuit mother board according to claim 8, wherein each of the external pad groups comprises a plurality of first pads and a plurality of second pads; and wherein each of the plurality of detachable resistors comprises a first end electrically connected to the first electrode plate or the second electrode plate of a corresponding capacitor through a corresponding one of the plurality of first pads, and a second end electrically connected to a corresponding detection terminal through a corresponding one of the plurality of the second pads.

10. The flexible circuit mother board according to claim 1, wherein, for one of the plurality of flexible circuit daughter boards and one of the plurality of external pad groups corresponding to the flexible circuit daughter board:

the external pad group comprises a plurality of external pads; and the first electrode plates and the second electrode plates of the plurality of capacitors are electrically connected to the plurality of detection terminals through the plurality of external pads.

11. The flexible circuit mother board according to claim 1, wherein, for one of the plurality of flexible circuit daughter boards, a surface of each of the plurality of capacitors is coated with a waterproof layer.

12. A detection method of a flexible circuit mother board, the flexible circuit mother board comprising:

a plurality of flexible circuit daughter boards;

at least one detection terminal group; and a plurality of external pad groups corresponding to the plurality of flexible circuit daughter boards in one-to-one correspondence, wherein each of the plurality of flexible circuit daughter boards has a bonding pad area adjacent to a corresponding one of the plurality of external pad groups, wherein each of the at least one detection terminal group detects at least one of the plurality of flexible circuit daughter boards, and each of the at least one detection terminal group comprises a plurality of detection terminals; and wherein each of the plurality of flexible circuit daughter boards comprises a plurality of capacitors, each of the plurality of capacitors comprises a first electrode plate and a second electrode plate, and each of the first electrode plate and the second electrode plate is electrically connected to one of the plurality of detection terminals, wherein the detection method being used to detect the flexible circuit mother board and comprises:

pairing two of the plurality of detection terminals of one of the at least one detection terminal group to form a detection terminal pair for detecting, wherein a detection terminal of the detection terminal pair is electrically connected to at least one first electrode plate of the plurality of capacitors of at least one of the plurality of flexible circuit daughter boards, and another detection terminal of the detection terminal pair is electrically connected to at least one second electrode plate of the plurality of capacitors of at least one of the plurality of flexible circuit daughter boards;

connecting the detection terminal pair to a constant voltage source, wherein one detection terminal of the detection terminal pair is grounded, and the other one detection terminal of the detection terminal pair is connected to a constant voltage, the constant voltage having a voltage value greater than a withstand voltage value of at least one capacitor electrically connected the detection terminal pair;

detecting a current in a loop where the detection terminal pair and the at least one capacitor are located to obtain a primary detection current value; and comparing the primary detection current value with a first current threshold corresponding to the detection terminal pair, wherein in response to a comparison result of the primary detection current value being greater than the first current threshold, it is determined that the at least one capacitor is abnormal; and in response to a comparison result of the primary detection current value being smaller than or equal to the first current threshold, it is determined that each of the at least one capacitor is normal.

13. The detection method according to claim 12,
wherein the flexible circuit mother board further comprises a plurality of detachable resistors;
wherein in one flexible circuit daughter board and one detection terminal group corresponding to the one flexible circuit daughter board: one detachable resistor corresponds to one detection terminal, and at least one of the first electrode plate or the second electrode plate of the capacitor is electrically connected to the detection terminal through the one detachable resistor;
wherein each flexible circuit daughter board comprises p capacitors, where p is an integer and p≥2; the p capacitors in each flexible circuit daughter board are arranged in a same manner, and the p capacitors comprises a first capacitor, a second capacitor . . . , and a $p^{th}$ capacitor;
wherein the one detection terminal group is configured to detect at least n flexible circuit daughter boards, where n is a positive integer and n≥2; each of the n flexible circuit daughter boards comprises a $q^{th}$ capacitor, where q is a positive integer and q≤p; and the first electrode plate or the second electrode plate of the $q^{th}$ capacitor is electrically connected to a same detection terminal through the detachable resistor;
wherein said detecting the current in the loop where the detection terminal pair and the at least one capacitor is located to obtain the primary detection current value comprises: calculating a sum of currents in the capacitors in the n flexible circuit daughter boards as the primary detection current value;
wherein said comparing the primary detection current value with the first current threshold comprises: calculating a sum of current thresholds in the capacitors in the n flexible circuit daughter boards as the first current threshold; and wherein following said determining that the at least one capacitor is abnormal if the primary detection current value is greater than the first current threshold, the detection method further comprises:
removing one detachable resistor electrically connected to the detection terminal connected to the constant voltage;
keeping the detection terminal pair being connected to the same constant voltage source, and detecting a current in the loop where the detection terminal pair and the at least one capacitor are located to obtain a secondary detection current value;
comparing the secondary detection current value with a secondary current threshold, wherein the secondary current threshold is related to a number of remaining detachable resistors electrically connected to the detection terminals connected to the constant voltage other than the removed detachable resistor;
if the secondary detection current value is smaller than or equal to the secondary current threshold, determining that the flexible circuit daughter board, to which the capacitor electrically connected to the removed detachable resistor belongs, comprises the abnormal capacitor; and
if the secondary detection current value is greater than the secondary current threshold, determining that the flexible circuit daughter board, to which the capacitor electrically connected to the removed detachable resistor belongs, comprises no abnormal capacitor.

14. The detection method according to claim 12,
wherein each of the plurality of flexible circuit daughter boards comprises p capacitors, where p is an integer and p≥2; and the p capacitors comprise a first capacitor, a second capacitor . . . , and a $p^{th}$ capacitor;
wherein for one flexible circuit daughter board and one detection terminal group corresponding to the flexible circuit daughter board:
the detection terminal group comprises a first common terminal and at least one second common terminal, wherein the first electrode plate of each capacitor in the flexible circuit daughter board is connected to the first common terminal, and the at least one second common terminal is electrically connected to the second electrode plates of m capacitors, where m is a positive integer and p≥m≥2;
the flexible circuit mother board further comprises a plurality of detachable resistors, each of the m capacitors electrically connected to the same second common terminal corresponds to one of plurality of detachable resistors, and the second electrode plate of each of the m capacitors is electrically connected to the at least one second common terminal through the corresponding detachable resistor;
wherein said detecting the detection terminal pair comprising two detection terminals in the detection terminal group comprises: detecting the detection terminal pair comprising the first common terminal and the second common terminal;
wherein said connecting the detection terminal pair to the constant voltage source comprises: connecting the first common terminal to ground, and connecting the second common terminal to the constant voltage; and wherein after determining that the at least one capacitor includes an abnormal capacitor if the primary detection current value is greater than the first current threshold, the detection method further comprises:
  removing one detachable resistor electrically connected to the second common terminal;
  keeping the detection terminal pair being connected to the same constant voltage source, and detecting a current in a loop where the detection terminal pair and the capacitors are located to obtain a secondary detection current value;
  comparing the secondary detection current value with a secondary current threshold, wherein the secondary current threshold is related to a number of remaining detachable resistors electrically connected to the second common terminal other than the removed detachable resistor;
  if the secondary detection current value is smaller than or equal to the secondary current threshold, determining that the capacitor electrically connected to the removed detachable resistor is abnormal; and
  if the secondary detection current value is greater than the secondary current threshold, determining that the capacitor electrically connected to the removed detachable resistor is normal.

15. A detection method of a flexible circuit mother board, the flexible circuit mother board comprising:
  a plurality of flexible circuit daughter boards;
  at least one detection terminal group; and
  a plurality of external pad groups corresponding to the plurality of flexible circuit daughter boards in one-to-one correspondence,
  wherein each of the plurality of flexible circuit daughter boards has a bonding pad area adjacent to a corresponding one of the plurality of external pad groups,
  wherein each of the at least one detection terminal group detects at least one of the plurality of flexible circuit daughter boards, and each of the at least one detection terminal group comprises a plurality of detection terminals; and
  wherein each of the plurality of flexible circuit daughter boards comprises a plurality of capacitors, each of the plurality of capacitors comprises a first electrode plate and a second electrode plate, and each of the first electrode plate and the second electrode plate is electrically connected to one of the plurality of detection terminals,
  wherein the detection method being used to detect the flexible circuit mother board and comprises:
    placing the flexible circuit mother board in an aging detection environment, and monitoring the flexible circuit mother board in real time;
    pairing two of the plurality of detection terminals of one of the at least one detection terminal group to form a detection terminal pair for detecting, wherein one detection terminal of the detection terminal pair is electrically connected to at least one first electrode plate of the plurality of capacitors of at least one of the plurality of flexible circuit daughter boards, and the other one detection terminal of the detection terminal pair is electrically connected to at least one second electrode plate of the plurality of capacitors of at least one of the plurality of flexible circuit daughter boards;
    connecting the detection terminal pair to a constant voltage source, wherein one detection terminal of the detection terminal pair is grounded, and the other one detection terminal of the detection terminal pair is connected to a constant voltage having a voltage value smaller than or equal to a withstand voltage value of the at least one capacitor electrically connected the detection terminal pair;
    detecting a current in a loop where the detection terminal pair and the at least one capacitor are located to obtain a primary detection current value; and
    comparing the primary detection current value with a first current threshold corresponding to the detection terminal pair, wherein in response to a comparison result of the primary detection current value being greater than the first current threshold, it is determined that the at least one capacitor is abnormal; and in response to a comparison result of the primary detection current value being smaller than or equal to the first current threshold, it is determined that each of the at least one capacitor is normal.

16. The detection method according to claim 15,
  wherein the flexible circuit mother board further comprises a plurality of detachable resistors, and
  wherein in one flexible circuit daughter board and one detection terminal group corresponding to the one flexible circuit daughter board:
    one detachable resistor corresponds to one detection terminal, and each of the first electrode plate and/or the second electrode plate of the capacitor is electrically connected to the one detection terminal through the one detachable resistor;
    each flexible circuit daughter board comprises p capacitors, where p is an integer and p≥2; the p capacitors in each flexible circuit daughter board are arranged in a same manner, and the p capacitors comprises a first capacitor, a second capacitor . . . , and a $p^{th}$ capacitor;
    the one detection terminal group is configured to detect at least n flexible circuit daughter boards, where n is a positive integer and n≥2; each of the n flexible circuit daughter boards comprises a $q^{th}$ capacitor, where q is a positive integer and q≤p; and the first electrode plate or the second electrode plate of the $q^{th}$ capacitor is electrically connected to a same detection terminal through the detachable resistor;
    said detecting the current in the loop where the detection terminal pair and the capacitors are located to obtain the primary detection current value comprises: calculating a sum of currents in the capacitors in the n flexible circuit daughter boards as the primary detection current value;
    said comparing the primary detection current value with the first current threshold comprises: calculating a sum of current thresholds in the capacitors in the n flexible circuit daughter boards as the first current threshold; and
    after said determining that the at least one capacitor is abnormal if the primary detection current value is greater than the first current threshold, the detection method further comprises:
      removing one detachable resistor electrically connected to the detection terminal connected to the constant voltage source;
      keeping the detection terminal pair being connected to the same constant voltage source, and detecting a current in the loop where the detection terminal pair and the capacitor are located to obtain a secondary detection current value;

comparing the secondary detection current value with a secondary current threshold, wherein the secondary current threshold is related to a number of remaining detachable resistors electrically connected to the detection terminals connected to the constant voltage other than the removed detachable resistor;

if the secondary detection current value is smaller than or equal to the secondary current threshold, determining that the flexible circuit daughter board, to which the capacitor electrically connected to the removed detachable resistor belongs, comprises the at least one capacitor determined to be abnormal; and if the secondary detection current value is greater than the secondary current threshold, determining that the flexible circuit daughter board, to which the capacitor electrically connected to the removed detachable resistor belongs, comprises no abnormal capacitor.

17. The detection method according to claim 15, wherein each of the plurality of flexible circuit daughter boards comprises p capacitors, where p is an integer and $p \geq 2$; and the p capacitors comprise a first capacitor, a second capacitor . . . , and a $p^{th}$ capacitor;

wherein for one flexible circuit daughter board and one detection terminal group corresponding to the flexible circuit daughter board:

the detection terminal group comprises a first common terminal and at least one second common terminal, wherein the first electrode plate of each capacitor in the flexible circuit daughter board is connected to the first common terminal, and the one second common terminal is electrically connected to the second electrode plates of m capacitors, where m is a positive integer and $p \geq m \geq 2$;

the flexible circuit mother board further comprises a plurality of detachable resistors, each of the m capacitors electrically connected to the same second common terminal corresponds to one of plurality of detachable resistors, and the second electrode plate of each of the m capacitors is electrically connected to the one second common terminal through the corresponding detachable resistor;

said detecting the detection terminal pair comprising two detection terminals in the detection terminal group comprises: detecting the detection terminal pair comprising the first common terminal and the second common terminal;

said connecting the detection terminal pair to the constant voltage source comprises: connecting the first common terminal to ground, and connecting the second common terminal to the constant voltage;

after said determining that the at least one capacitor is abnormal if the primary detection current value is greater than the first current threshold, the detection method further comprises:

removing one detachable resistor electrically connected to the second common terminal;

keeping the detection terminal pair being connected to the same constant voltage source, and detecting a current in a loop where the detection terminal pair and the capacitors are located to obtain a secondary detection current value;

comparing the secondary detection current value with a secondary current threshold, wherein the secondary current threshold is related to a number of remaining detachable resistors electrically connected to the second common terminal other than the removed detachable resistor;

if the secondary detection current value is smaller than or equal to the secondary current threshold, determining that the capacitor electrically connected to the removed detachable resistor is abnormal; and if the secondary detection current value is greater than the secondary current threshold, determining that the capacitor electrically connected to the removed detachable resistor is normal.

* * * * *